United States Patent
Ohara et al.

(10) Patent No.: US 6,870,446 B2
(45) Date of Patent: Mar. 22, 2005

(54) HIGH FREQUENCY FILTER

(75) Inventors: Ryoichi Ohara, Kanagawa-ken (JP); Kazuhide Abe, Kanagawa-ken (JP); Takashi Kawakubo, Kanagawa-ken (JP); Hiroshi Yoshida, Kanagawa-ken (JP); Hiroshi Tsurumi, Kanagawa-ken (JP); Ryuichi Fujimoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/252,105

(22) Filed: Sep. 23, 2002

(65) Prior Publication Data

US 2003/0067368 A1 Apr. 10, 2003

(30) Foreign Application Priority Data

Sep. 21, 2001 (JP) .................................. P2001-288764
Mar. 29, 2002 (JP) .................................. P2002-097050
Mar. 29, 2002 (JP) .................................. P2002-097398

(51) Int. Cl.$^7$ ............................................... H03H 9/54
(52) U.S. Cl. ..................... 333/188; 333/189; 333/190; 333/191; 310/357
(58) Field of Search ............................. 333/186–192, 333/133; 310/322, 324, 334, 335, 357, 358, 363

(56) References Cited

U.S. PATENT DOCUMENTS

| | | | | |
|---|---|---|---|---|
| 4,451,753 A | * | 5/1984 | Ogawa et al. ............. | 310/315 |
| 5,446,306 A | | 8/1995 | Stokes et al. ............. | 257/416 |
| 5,910,756 A | * | 6/1999 | Ella ........................... | 333/133 |
| 6,204,737 B1 | * | 3/2001 | Ella ........................... | 333/187 |
| 6,278,342 B1 | * | 8/2001 | Ella ........................... | 333/189 |
| 6,437,484 B1 | * | 8/2002 | Nishimura et al. ........ | 310/324 |
| 6,583,688 B2 | * | 6/2003 | Klee et al. ................. | 333/188 |

FOREIGN PATENT DOCUMENTS

JP 10-75149 3/1998
JP 2001-308605 11/2001

OTHER PUBLICATIONS

John D. Larson, et al., "Power Handling and Temperature Coefficient Studies in FBAR Duplexers for the 1900 MHZ PCS Band", 2000 IEEE Ultrasonics Symposium, pp. 869–874, Oct. 2000.

* cited by examiner

*Primary Examiner*—Barbara Summons
(74) *Attorney, Agent, or Firm*—Oblon, Spivak, McClelland, Maier & Neustadt, P.C.

(57) ABSTRACT

A high frequency filter comprises thin film piezoelectric resonators connected in series between the input/output nodes, thin film piezoelectric resonators connected in parallel between the input/output nodes and a variable voltage circuit adapted to change the voltage applied to at least either the thin film piezoelectric resonators connected in series or the thin film piezoelectric resonators connected in parallel. The resonance characteristic of at least either the thin film piezoelectric resonators connected in series or the thin film piezoelectric resonator connected in parallel is shifted by changing the voltage applied by the variable voltage circuit to change the pass characteristic of the filter.

4 Claims, 19 Drawing Sheets

FIG. 19
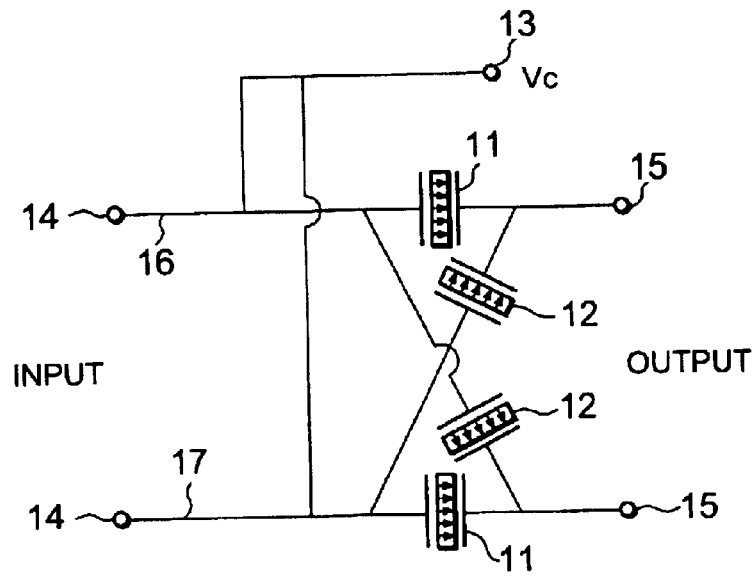
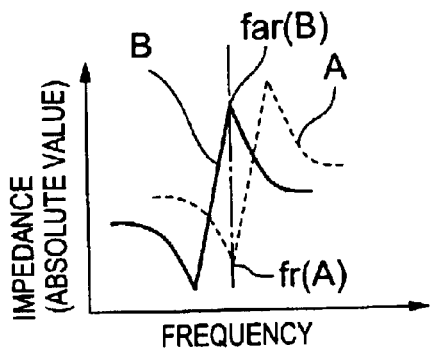
FIG. 20(a)
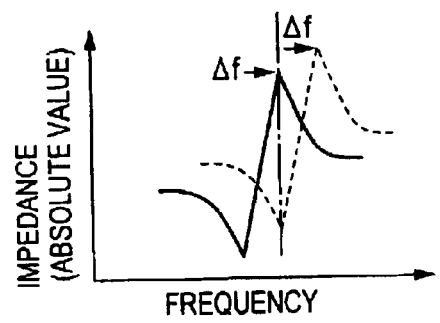
FIG. 20(b)
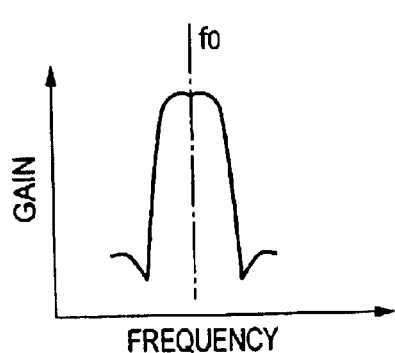
FIG. 20(c)
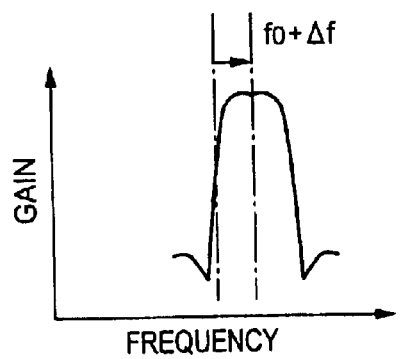
FIG. 20(d)

FIG. 21
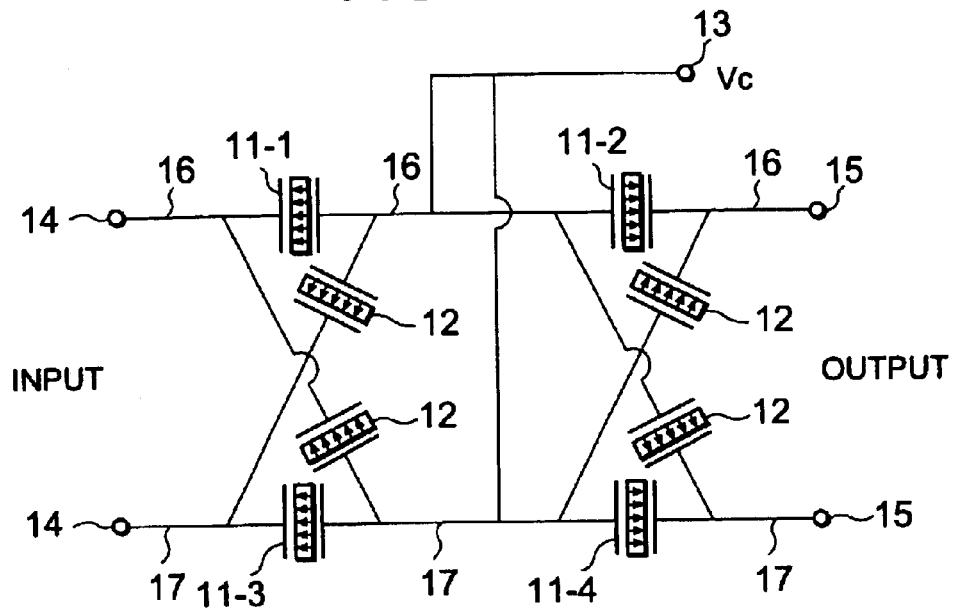
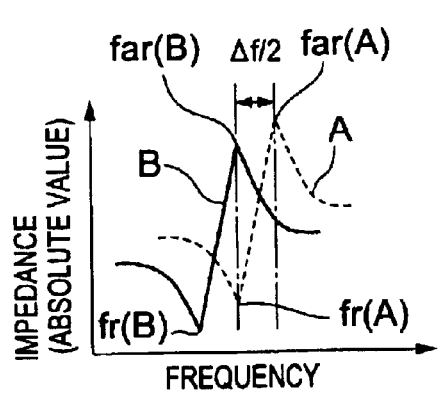
FIG. 22(a)
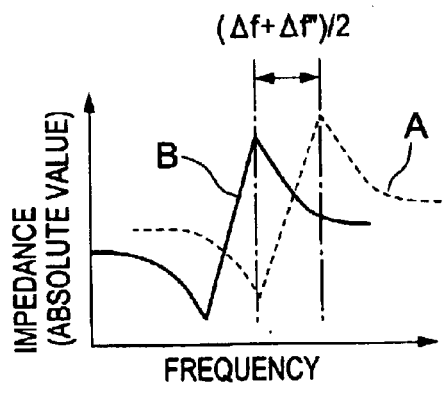
FIG. 22(b)
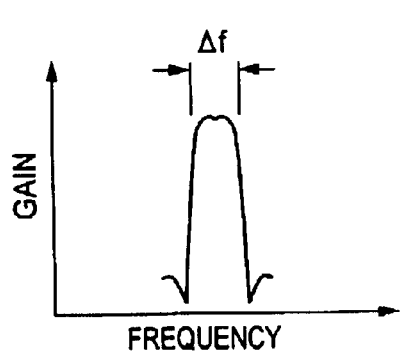
FIG. 22(c)
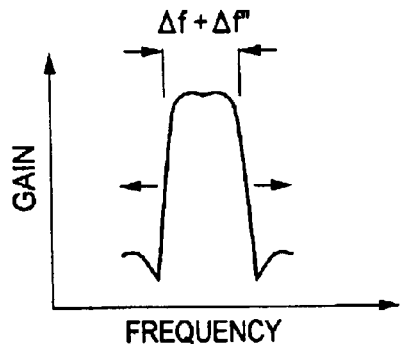
FIG. 22(d)

FIG. 23
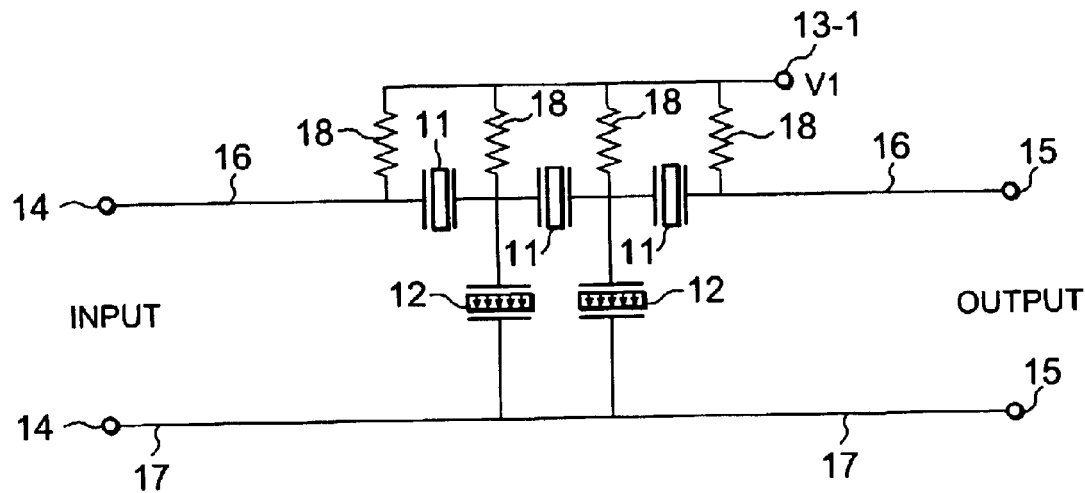
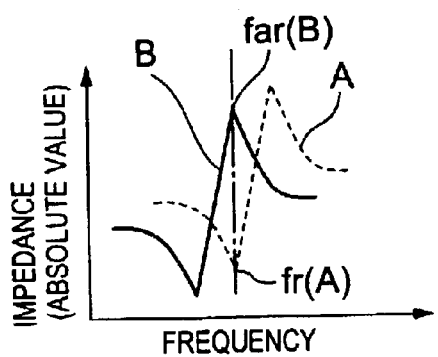
FIG. 24(a)
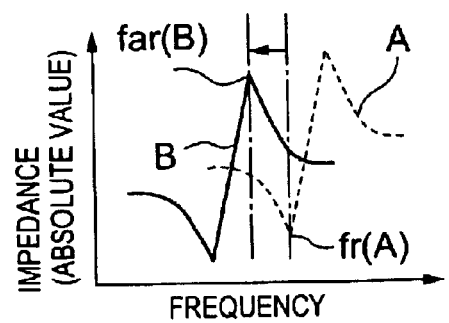
FIG. 24(b)
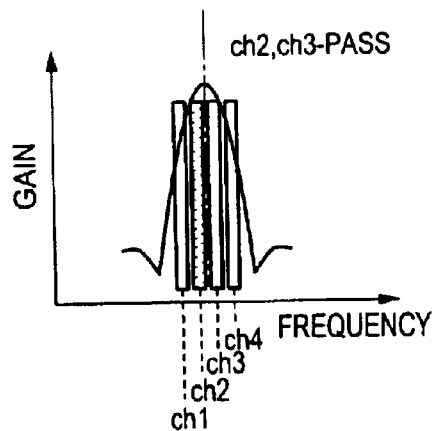
FIG. 24(c)
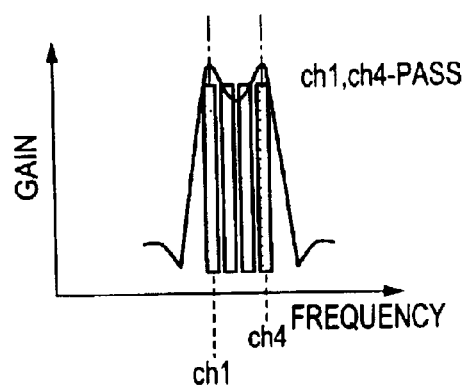
FIG. 24(d)

FIG. 25
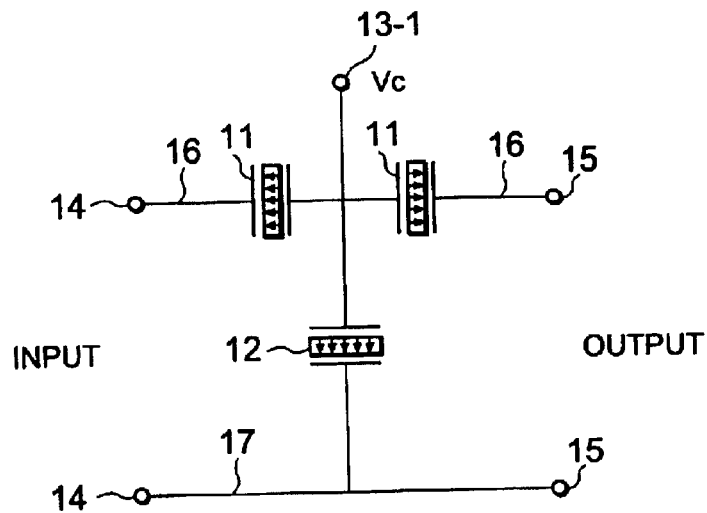
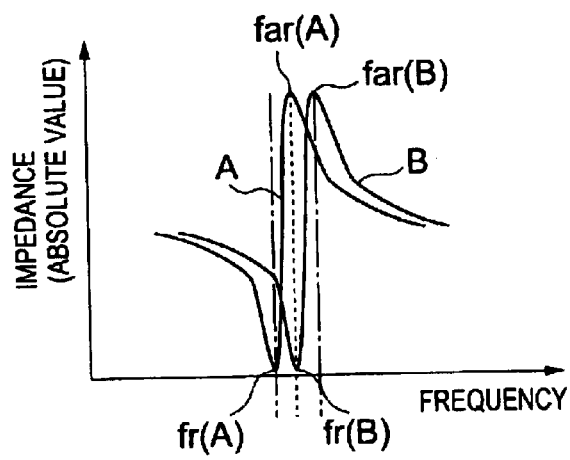
FIG. 26(a)
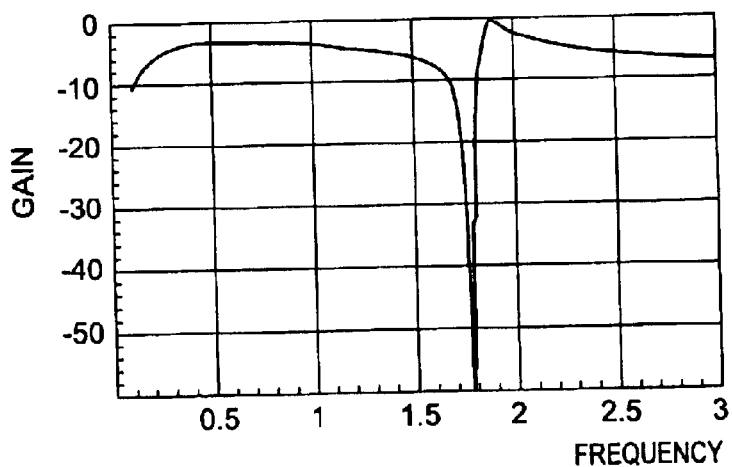
FIG. 26(b)

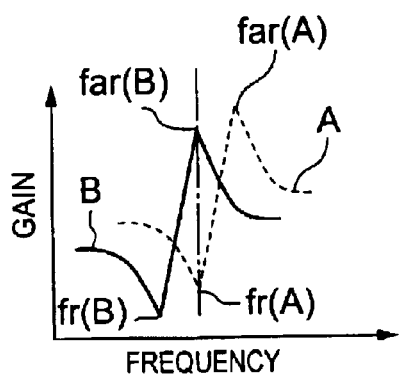
FIG. 30(a)
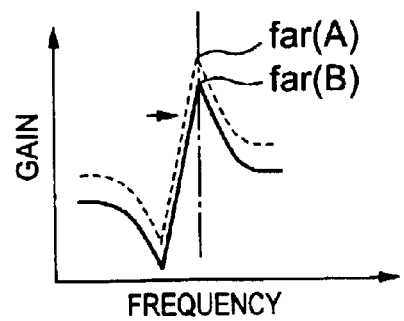
FIG. 30(b)
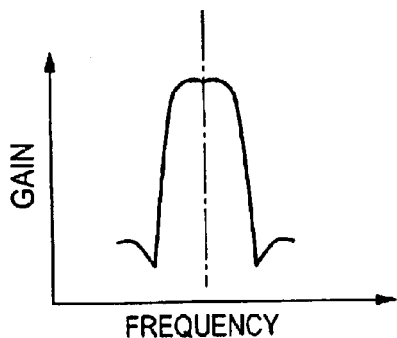
FIG. 30(c)
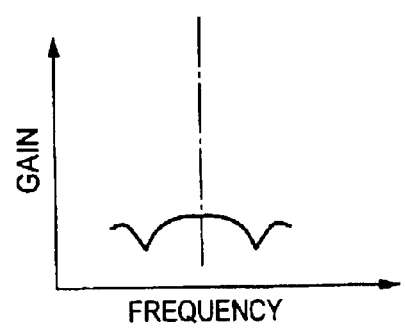
FIG. 30(d)
FIG. 31
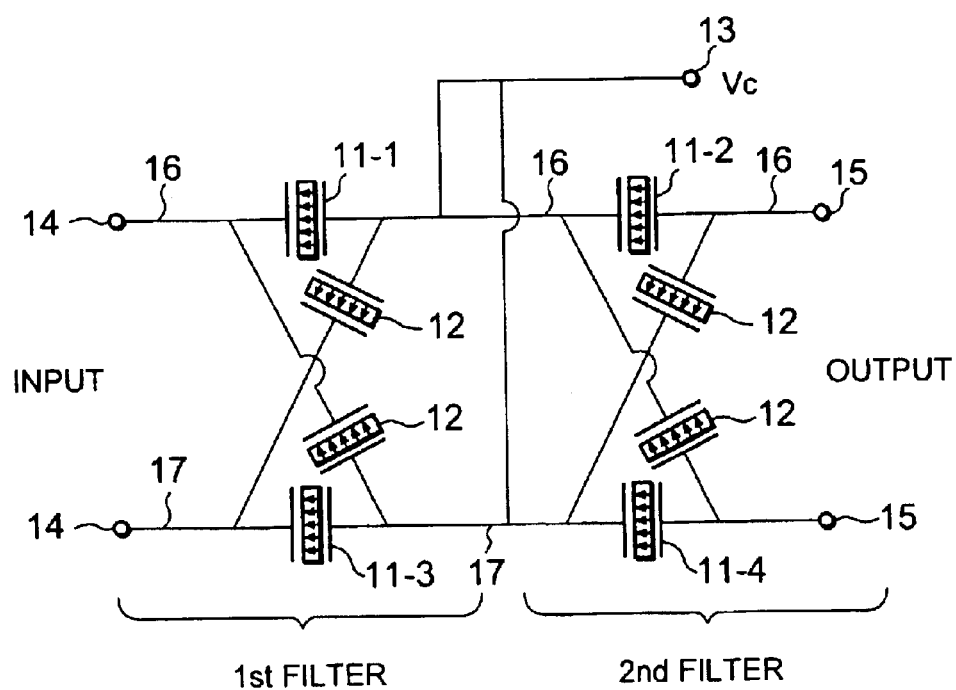

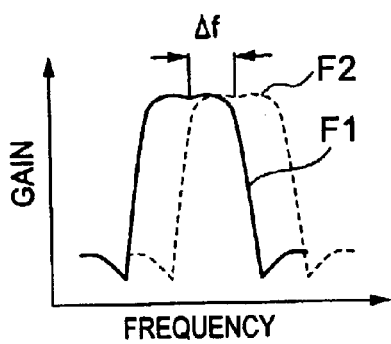
FIG. 32(a)
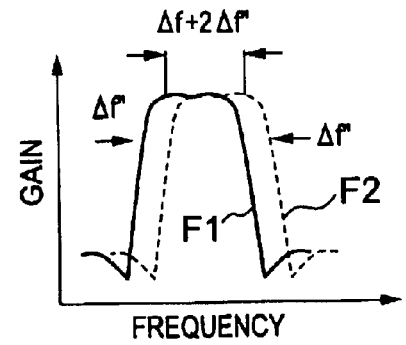
FIG. 32(b)
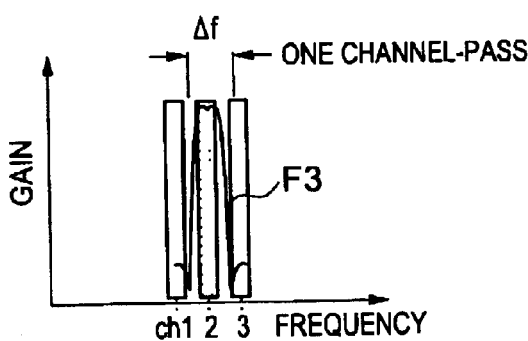
FIG. 32(c)
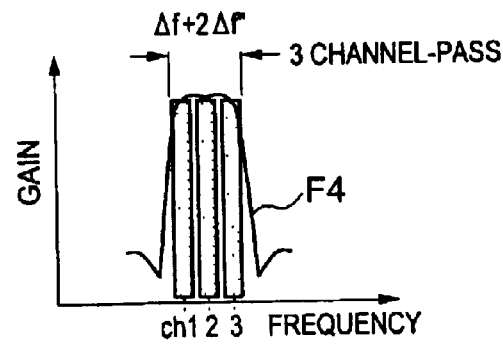
FIG. 32(d)
FIG. 33
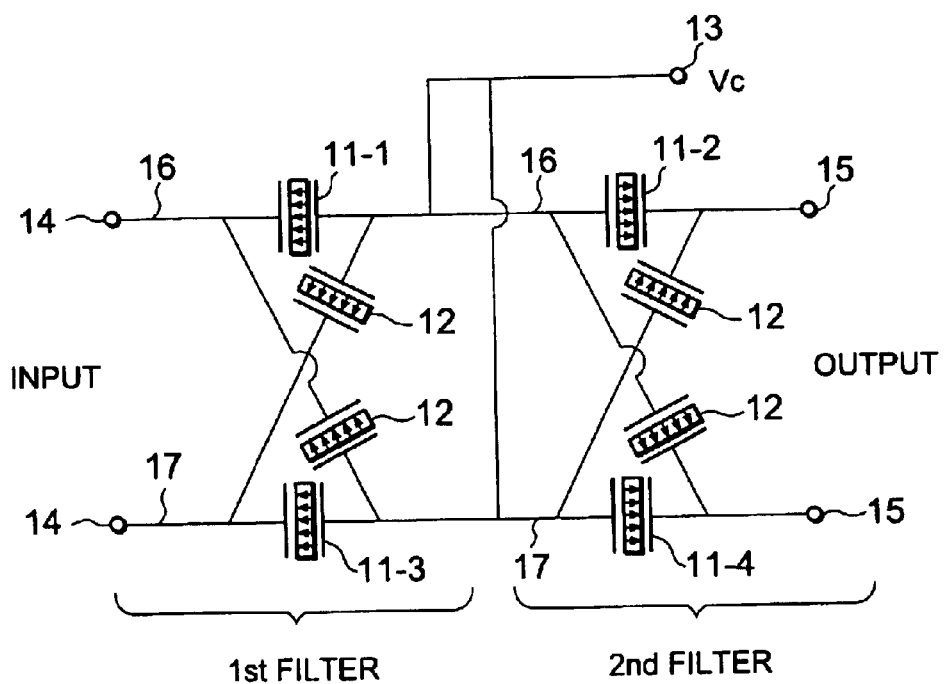

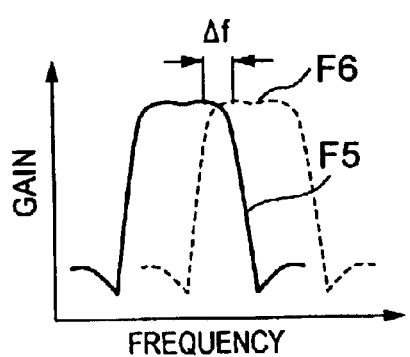
FIG. 34(a)
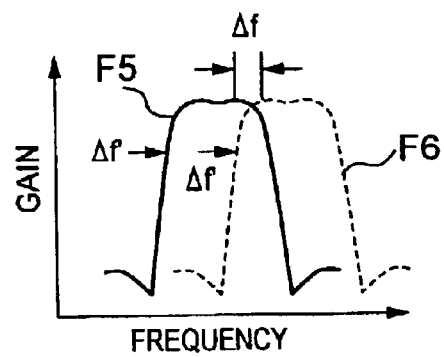
FIG. 34(b)
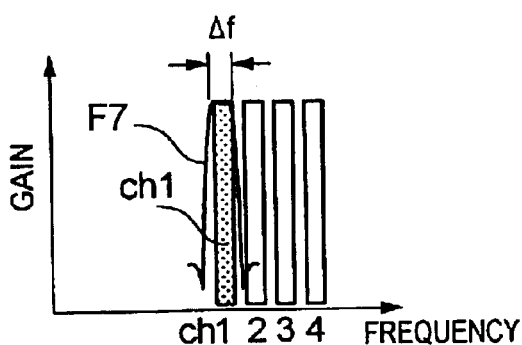
FIG. 34(c)
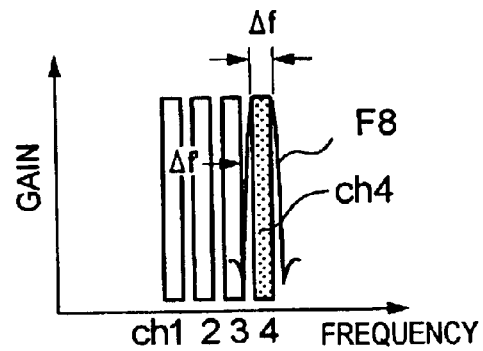
FIG. 34(d)
FIG. 35
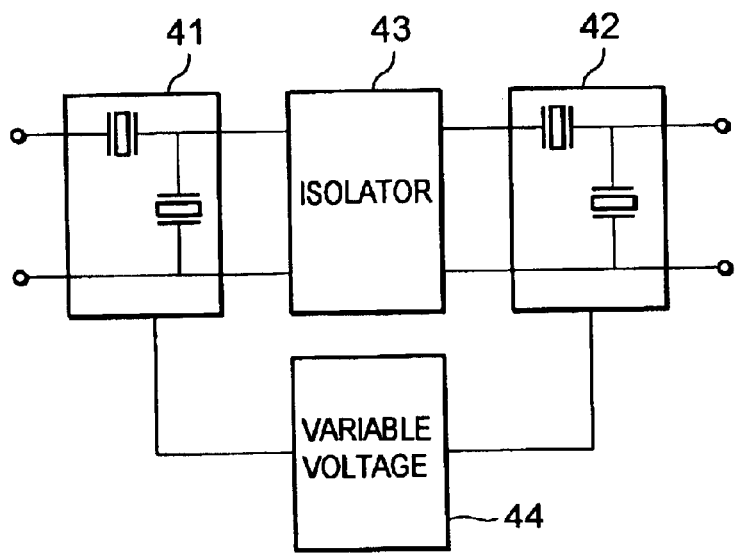

HIGH FREQUENCY FILTER

CROSS-REFERENCE TO RELATED APPLICATIONS

This application is based upon and claims the benefit of priority from the prior Japanese Patent Applications No. 2001-288764, filed on Sep. 21, 2001 and No. 2002-97398, filed on Mar. 29, 2002; the entire contents of which are incorporated herein by reference.

BACKGROUND OF THE INVENTION

1. Field of the Invention

This invention relates to a high frequency filter having variable filtering characteristics that can be changed in response to the control voltage applied to it.

2. Related Art

As a result the technological development in the field of radio communications and the introduction of new regulatory telecommunication systems in recent years, there is an ever-increasing demand for telecommunication devices that are adapted to a number of transmission/reception systems. For a telecommunication transmission/reception device to adapt itself to a plurality of transmission/reception systems, it needs to be provided with a number of filters that are formed by using a so-called bulk wave resonator such as a dielectric resonator, a surface acoustic wave (SAW) resonator, a crystal oscillator, or an LC resonator, and it needs to have respective pass band characteristics that are different from each other. However, such an arrangement is not appropriate from the viewpoint of downsizing the telecommunication device.

Therefore, development of a high frequency filter having variable filtering characteristics which can be made to change by an external control means has been expected from the viewpoint of reducing the number of filters to be used in such a telecommunication device and thereby down-sizing the device. Proposals that have been made in this technological field include those relating to devices comprising a resonance circuit realized by connecting a voltage control type variable capacitor such as varactor to a piezoelectric thin film resonator in series or in parallel (e.g., D. Penunuri, et al., "A tunable SAW Duplexer", Proc. IEEE Ultrasonics Symposium, 2000, pp. 361–366). However, such devices are accompanied by a problem that the resonance frequency depends on the electro-mechanical coupling coefficient $k^2$ of the resonator and hence the variable frequency range is narrow and that the filter characteristics can be degraded due to the low Q value of the varactor.

As pointed out above, the demand for telecommunication devices adapted to a plurality of transmission/reception systems has been increasing and hence there is a strong demand for small high frequency filters having variable filtering characteristics that advantageously can be made to change appropriately.

In view of the above identified circumstances, it is therefore the object of the present invention to provide a novel down-sized high frequency filter having filtering characteristics, including a broad variable frequency range that is variable and can be made to change by an appropriate external control means, and showing a high frequency stability that is not significantly degraded with time.

BRIEF SUMMARY OF THE INVENTION

The above object of the invention is achieved by providing a filter comprising a thin film piezoelectric resonator formed by using a single crystal ferroelectric thin film whose polarization is effectively oriented in the direction of the film height and a pair of electrodes sandwiching the ferroelectric thin film and adapted to change its resonance frequency by applying a voltage between the electrodes.

The inventors of the present invention studied extensively about the use of a ferroelectric material as piezoelectric in a thin film piezoelectric resonator from a theoretical point of view and also by looking into the results obtained by conducting a number of experiments. As a result, they found that ferroelectric materials have an intrinsic property that the sonic velocity in the ferroelectric material can vary remarkably when an electric field is applied thereto and that the oscillation frequency of a ferroelectric body can be made to be variable by applying a control voltage to the ferroelectric body when a requirement of orienting the direction of polarization to that of the film height and certain other requirements are met.

Thus, it is possible to provide a voltage control type resonator adapted to modulate its oscillation frequency by arranging a pair of electrodes sandwiching a ferroelectric film and applying a variable voltage between the electrodes.

The variable range of frequency of such a voltage control type resonator can be determined without referring to the electro-mechanical coupling-coefficient because the resonance frequency itself of the ferroelectric film can be changed. Additionally, it is possible to provide a filter having a circuit configuration that does not require the use of varactors that show a low Q value and hence are not suited for integration.

More specifically, the ferroelectric material to be used as piezoelectric body needs be a single crystal film or single orientation film that is polarized solely in the thickness direction. It is absolutely necessary to polarize the ferroelectric film in the thickness direction in order to fully exploit the piezoelectric properties of a ferroelectric film and change its frequency by applying a voltage. A single crystal ferroelectric film can be produced relatively easily by utilizing epitaxial growth.

In an aspect of the present invention, there is provided a high frequency filter comprising:
- a signal input node;
- a signal output node;
- a plurality of thin film piezoelectric resonators being coupled with the signal input and the signal output nodes, and including at least one of a variable resonance thin film piezoelectric resonator which has a ferroelectric thin film polarized in its thickness direction and a pair of electrodes formed on the opposite major surfaces of the thin film with variable resonance characteristics to be changed in response to an applied voltage between the pair of electrodes; and
- a voltage source being connected to the variable resonance thin film piezoelectric resonator so that a filtering characteristic of the variable resonance thin film piezoelectric resonator is controlled by changing the voltage applied from the voltage source.

Preferably, all of said thin film piezoelectric resonators are made of a ferroelectric thin film polarized solely in the direction of the height.

Preferably, said ferroelectric thin film has an orientation full width at half maximum not smaller than 0.1° and not greater than 5°.

Preferably, said ferroelectric thin film contains barium titanate as principal ingredient.

In another aspect of the present invention, there is provided a high frequency filter comprising:

a signal input node;

a signal output node a first variable resonance thin film piezoelectric resonator being coupled in series with the signal input and the signal output nodes which has a ferroelectric thin film polarized in the thickness direction and a pair of electrodes formed on the opposite major surfaces of the thin film with a variable resonance characteristic to be changed in response to an applied voltage between the pair of electrodes;

a second variable resonance thin film piezoelectric resonator being coupled in parallel with the signal input and the signal output nodes that has a ferroelectric thin film polarized in the thickness direction and a pair of electrodes formed on the opposite major surfaces of the thin film with a variable resonance characteristic to be changed in response to an applied voltage between the pair of electrodes; and a voltage source being connected to the first and second variable resonance thin film piezoelectric resonators to apply the voltage between the pair of electrodes so that a filtering characteristic of at least one of the variable resonance thin film piezoelectric resonators is controlled by changing the voltage applied from the voltage source.

Preferably, the filter comprises a variable voltage source changing the voltage applied to the thin film piezoelectric resonators connected in series and thin film piezoelectric resonator connected in parallel to shift both the resonance frequency of the thin film piezoelectric resonator connected in series and the anti-resonance frequency of the thin film piezoelectric resonator connected in parallel as the resonance frequency of the thin film piezoelectric resonator connected in series and the anti-resonance frequency of the thin film piezoelectric resonator connected in parallel are substantially coincident with each other, whereby a center frequency of the pass band of the filter is controlled.

Preferably, the filter comprises a variable voltage source changing the voltage applied to at least one of the thin film piezoelectric resonator connected in series and the thin film piezoelectric resonator connected in parallel to change at least one of a gap between the resonance frequency and the anti-resonance frequency of the thin film piezoelectric resonator connected in series and a gap between the resonance frequency and the anti-resonance frequency of the thin film piezoelectric resonator connected in parallel, as the resonance frequency of the thin film piezoelectric resonators connected in series and the anti-resonance frequency of the thin film piezoelectric resonators connected in parallel are substantially coincident with each other, whereby the pass band is controlled.

Preferably, the filter comprises a variable voltage source changing the voltage applied to at least one of the thin film piezoelectric resonators connected in series and the thin film piezoelectric resonators connected in parallel to change at least one of the gap between the resonance frequency of the thin film piezoelectric resonators connected in series and the anti-resonance frequency of the thin film piezoelectric resonators connected in parallel as the resonance frequency of the thin film piezoelectric resonators connected in series and the anti-resonance frequency of the thin film piezoelectric resonators connected in parallel substantially are substantially coincident with each other, whereby a ripple position or a ripple profile in a pass band of the filter is controlled.

Preferably, the filter comprises a variable voltage source changing the voltage applied to the thin film piezoelectric resonator connected in series and the thin film piezoelectric resonator connected in parallel to shift both the anti-resonance frequency of the thin film piezoelectric resonator connected in series and the resonance frequency of the thin film piezoelectric resonator connected in parallel as the anti-resonance frequency of the thin film piezoelectric resonator connected in series and the resonance frequency of the thin film piezoelectric resonator connected in parallel are coincident with each other, whereby the center frequency of a rejection band of the filter is controlled.

Preferably, the filter comprises a variable voltage source changing the voltage applied to at least one of the thin film piezoelectric resonator connected in series and the thin film piezoelectric resonator connected in parallel to change at least one of a gap between the resonance frequency and the anti-resonance frequency of the thin film piezoelectric resonator connected in series and a gap between the resonance frequency and the anti-resonance frequency of the thin film piezoelectric resonator connected in parallel as the anti-resonance frequency of the thin film piezoelectric resonator connected in series and the resonance frequency of the thin film piezoelectric resonator connected in parallel are coincident with each other, whereby a rejection band of the filter is controlled.

Preferably, the filter comprises a variable voltage source changing the voltage applied to the thin film piezoelectric resonator connected in series or the thin film piezoelectric resonator connected in parallel to select a pass band mode obtained when the resonance frequency of the thin film piezoelectric resonator connected in series and the anti-resonance frequency of the thin film piezoelectric resonator connected in parallel are substantially coincident with each other or all rejection band mode obtained when the resonance frequency of the thin film piezoelectric resonator connected in series and the resonance frequency of the thin film piezoelectric resonator connected in parallel are substantially coincident with each other.

In still another aspect of the invention, there is provided a high frequency filter comprising:

a first input and a second input nodes;

a first output and a second output nodes;

thin film piezoelectric resonators connected in series between the first input node and the first output node;

thin film piezoelectric resonators connected in parallel between the first input node and the second input node or between the first output node and the second output node;

at least either the thin film piezoelectric resonators connected in series or the thin film piezoelectric resonators connected in parallel are variable thin film piezoelectric resonators, each being made of a ferroelectric thin film polarized in the thickness direction with a pair of electrodes arranged at the opposite major surfaces of the thin film, with variable resonance characteristics to be changed in response to the applied voltage between the electrodes; and a variable voltage source connected to the variable thin film piezoelectric resonators to apply a variable voltage to the opposite ends of the variable thin film piezoelectric resonators, whereby a frequency pass band of the filter is controlled by changing the voltage applied to the thin film piezoelectric resonators by the variable voltage source.

In still another aspect of the invention, there is provided a high frequency filter comprising:

at least two filter units, the units connected by cascade connection, each of the units comprising at least one of thin film piezoelectric resonator connected in series and at least one of thin film piezoelectric resonator connected in parallel, the film piezoelectric resonator being made of a ferroelectric thin film polarized in the thickness direction and having a pair of electrodes arranged at the opposite major surfaces of the thin film with variable resonance characteristics to be changed in response to an applied voltage between the electrodes; and a voltage source connected to the filter units to apply the voltage to the units for changing the resonance characteristics thereof.

Preferably, the filter further comprising at least one isolator or buffer amplifier connected between the filter units.

In a further aspect of the invention, there is provided a high frequency filter comprising:

at least two filter units having different pass band frequencies with each other and arranged in parallel, each of the units comprising at least one of thin film piezoelectric resonator connected in series and at least one of thin film piezoelectric resonator connected in parallel, the film piezoelectric resonator being made of a ferroelectric thin film polarized in the thickness direction and having a pair of electrodes arranged at the opposite major surfaces of the thin film with variable resonance characteristics to be changed in response to an applied voltage between the electrodes;

a switch for switching the filter units to select a pass band frequency; and a voltage source connected to the filter units to apply a voltage to change the resonance characteristics thereof.

BRIEF DESCRIPTION OF THE DRAWINGS

FIG. 18($b$) is a graph illustrating the change in the resonance frequency and also the change in the anti-resonance frequency relative to the variable voltage applied to the resonator of FIG. 18($a$).

FIG. 19 is a circuit diagram of still another embodiment of filter according to the invention, which is a variable center frequency type filter.

FIGS. 20($a$) through 20($d$) are graphs illustrating the principle of operation of the variable center frequency type filter illustrated in FIG. 19, FIGS. 20($a$) and 20($b$) illustrating the impedance of the resonators while FIGS. 20($c$) and 20($d$) illustrate the pass-gain of the resonators.

FIG. 21 is a circuit diagram of still another embodiment of filter according to the invention, which is a variable band width type filter.

FIGS. 22($a$) through 22($d$) are graphs illustrating the principle of operation of the variable band width type filter illustrated in FIG. 21, FIGS. 22($a$) and 22($b$) illustrating the impedance of the resonators while FIGS. 22($c$) and 22($d$) illustrate the pass-gain of the resonators.

FIG. 23 is a circuit diagram of still another embodiment of filter according to the invention, which is a variable ripple profile type filter.

FIGS. 24($a$) through 24($d$) are graphs illustrating the principle of operation of the variable ripple profile type filter illustrated in FIG. 23, FIGS. 24($a$) and FIG. 24($b$) illustrating the impedance of the resonators while FIGS. 24($c$) and 24($d$) illustrate the pass-gain of the resonators.

FIG. 25 is a circuit diagram of still another embodiment of filter according to the invention, which is a variable frequency band block type filter.

FIGS. 26($a$) and 26($b$) are graphs illustrating the principle of operation of the variable ripple profile type filter illustrated in FIG. 25, FIG. 26($a$) illustrates the impedance of the resonators while FIG. 26($b$) illustrates the pass-gain of the resonators.

FIGS. 30(a) through 30(d) are graphs illustrating the principle of operation of the switching filters of the out-of-band attenuation switching filter of FIG. 29, FIGS. 30(a) and 30(b) illustrating the impedance of the resonators while FIGS. 30(c) and 30(d) illustrate the pass-gain of the resonators.

FIG. 31 is a circuit diagram of still another embodiment of filter according to the invention, which is a variable band width type filter.

FIGS. 32(a) through 32(d) are graphs illustrating the principle of operation of the variable band width type filter illustrated in FIG. 31, FIGS. 32(a) and 32(b) illustrating the impedance of the resonators while FIGS. 32(c) and 32(d) illustrate the pass-gain of the resonators.

FIG. 33 is a circuit diagram of still another embodiment of filter according to the invention, which is a channel selection filter.

FIGS. 34(a) through 34(d) are graphs illustrating the principle of operation of the channel selection filter illustrated in FIG. 31, FIGS. 34(a) and 34(b) illustrate the impedance of the resonators while FIGS. 34C and 34D illustrate the pass-gain of the resonators.

FIG. 35 is a schematic block diagram of still another embodiment of the invention.

DETAILED DESCRIPTION OF THE INVENTION

Figure 1:
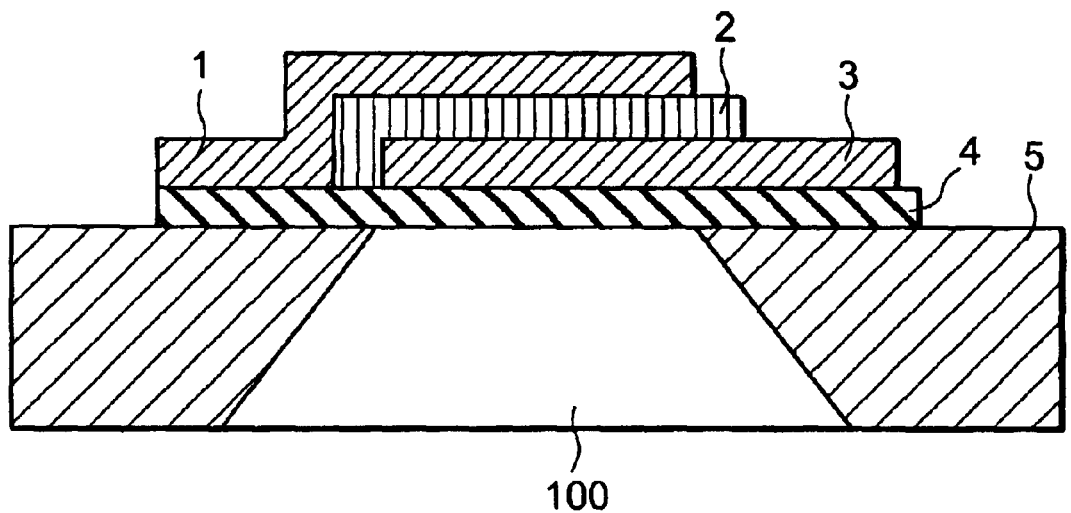
FIG. 1 is a schematic cross sectional view of an example of thin film piezoelectric resonator to be used in a filter circuit according to the invention as realized by using a ferroelectric member and adapted to utilize a bulk acoustic wave.

Now, the present invention will be described by referring to the accompanying drawings that illustrate preferred embodiments of the invention. However, the present invention is by no means limited to the embodiments described below, which may be modified or altered in various different ways without departing from the scope of the present invention.

Firstly, the inventors of the present invention looked into materials that can advantageously be used for the piezoelectric member of a thin film piezoelectric resonator to be used forming a high frequency filter. As a result, it was found that a ferroelectric film can be polarized to a large extent so as to make itself show a high electric field dependency and that such a film shows piezoelectric properties because it is voluntarily polarized and its material constants show a high voltage dependency.

Particularly, such a ferroelectric film needs to be polarized solely in the thickness direction so that resonances may be exploited by utilizing vertical oscillations in the thickness direction. Therefore, it is preferable to use a ferroelectric film that is oriented in the thickness direction. It is more preferable to use an epitaxially grown ferroelectric film that is orientated in the thickness direction.

Both the elastic coefficient and the electro-mechanical coupling coefficient of a ferro electric film show electric field dependency. The inventors of the present invention also found that the frequency pass characteristics of a filter can be controlled by means of a voltage when the filter comprises a thin film piezoelectric resonator formed by using a ferroelectric film that is oriented in the thickness direction.

Furthermore, the inventors of the present invention also found that a ferroelectric material made of barium titanate or PZT shows a high specific dielectric constant if compared with a piezoelectric material such as AlN or ZnO and therefore an advantage of down-sizing can be obtained by designing the resonator, taking impedance matching into consideration.

In the following, preferred embodiments comprising a piezoelectric member formed by using an epitaxially grown ferroelectric film typically made of barium titanate or PZT and oriented in the thickness direction will be described.

(Embodiment 1)

The inventors of the present invention studied extensively and intensively about switching filters adapted to switch the band pass characteristics and the all block characteristics. As a result, they found that a small and lightweight switching filter having a simple circuit configuration can be realized at low cost by using a thin film piezoelectric resonator adapted to change the resonance frequency not mechanically but electrically. Such a switching filter can effectively prevent mutual interferences of multi-band and those of transmission/reception signals along with unnecessary noises. A thin film piezoelectric resonator as used herein refers to a resonator adapted to utilize bulk acoustic waves in the thickness direction, or resonances of surface waves of the bulk of the entire thin film, and not a resonator such as SAW device adapted to utilize surface waves. Thin film piezoelectric resonators that can be used for the purpose of the invention include thin film bulk acoustic wave resonators.

When the resonance frequency is between 1 GHz and 2 GHz, the film thickness of the thin film is between 1 $\mu$m and 2 $\mu$m. As the required resonance frequency is raised in the future, the film thickness needs to be reduced. If the applicable frequency band is between 0.1 and 10 GHz, the practical film thickness will be found within a range between 0.1 and 20 $\mu$m.

Now, the principle underlying a high frequency filter according to the present invention will be described in detail below.

FIG. 1 is a schematic cross sectional view of an example of thin film piezoelectric resonator that can be used in this embodiment of the invention.

The thin film piezoelectric resonator is produced by forming an etching stopper layer 4 on a single crystal substrate 5, forming a resonator structure having a first electrode 3, a piezoelectric film 2 and a second electrode 1 on the etching stopper layer 4 and forming a cavity 100 by etching the single crystal substrate 5 from the rear surface thereof.

The thin film piezoelectric resonator is realized by utilizing the piezoelectric effect of the piezoelectric film 2 and the energy of piezoelectric oscillation is prevented from running away by the cavity 100 formed on the surface of the single crystal substrate 5. Note that the etching stopper layer 4 operates not only as stopper when forming the cavity 100 in the single crystal substrate 5 by etching but also as under layer for the epitaxial film formed on the etching stopper layer.

Figure 2:
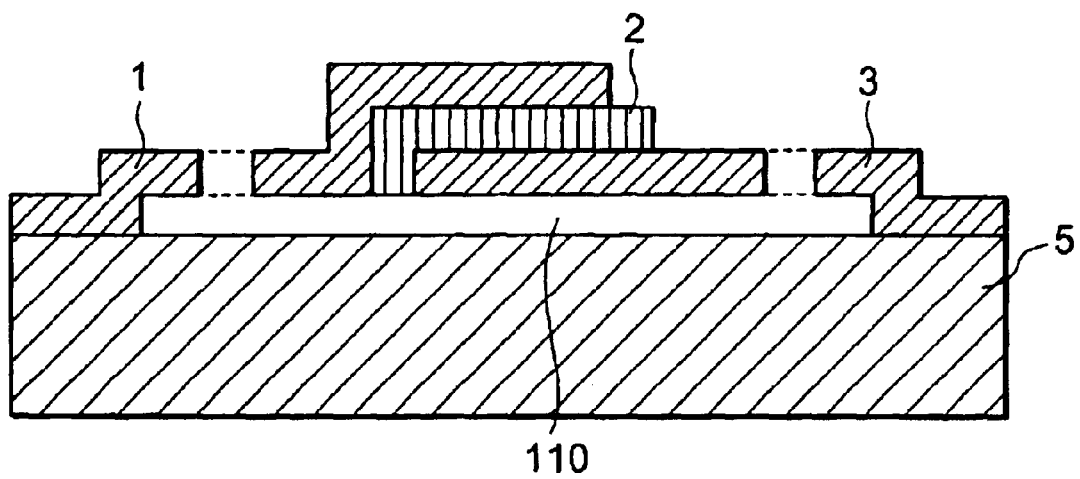
FIG. 2 is a schematic cross sectional view of another example of thin film piezoelectric resonator to be used in a filter circuit according to the invention as realized by using a ferroelectric member and adapted to utilize a bulk acoustic wave.

FIG. 2 is a schematic cross sectional view of another example of thin film piezoelectric resonator that can be used in this embodiment of filter circuit of the invention. The resonator has a gap 110 formed between the first electrode 3 and the single crystal substrate 5.

The gap 110 is provided to prevent the energy of piezoelectric oscillation of the resonator comprising a first electrode 1, a piezoelectric film 2 and a second electrode 1 from running away.

Figure 3:
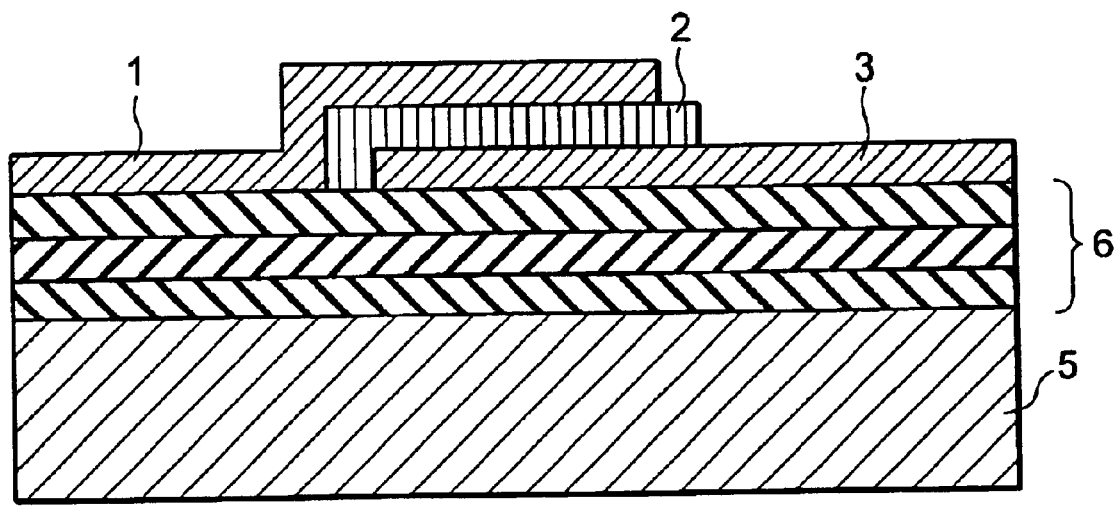
FIG. 3 is a schematic cross sectional view of still another example of thin film piezoelectric resonator to be used in a filter circuit according to the invention as realized by using a ferroelectric member and adapted to utilize a bulk acoustic wave.

FIG. 3 is a schematic cross sectional view of still another example of thin film piezoelectric resonator that can be used this embodiment of filter circuit of the invention. The thin film piezoelectric resonator is provided between the first electrode 3 and the single crystal substrate 5 with a Bragg reflector 6 which is a multilayer structure formed by arranging layers having different acoustic impedances.

The Bragg reflector 6 is also adapted to reflect a surface wave showing the resonance frequency of the resonator also having a first electrode 3, a piezoelectric film 2 and a second electrode 1 so as to prevent the energy of piezoelectric oscillation from running away.

Figure 4:
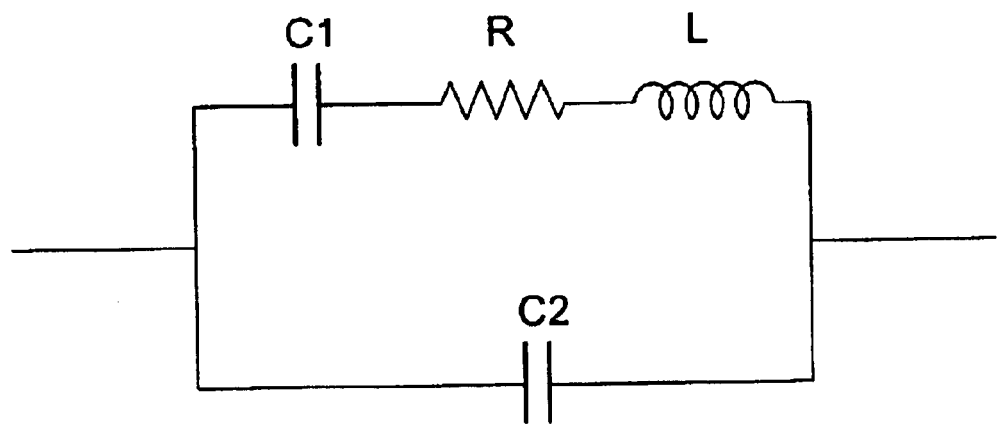
FIG. 4 is circuit diagram of an equivalent circuit of a thin film piezoelectric resonator adapted to utilize a bulk acoustic wave.

Each of the thin film resonators illustrated in FIGS. 1, 2 and 3 and having the above described respective configurations has a resonance frequency and an anti-resonance frequency that are determined as a function of the density and/or the film thickness of the piezoelectric film 2 and/or the effect of the mass load of the first electrode 3 and the second electrode 1. FIG. 4 is a circuit diagram of an equivalent circuit illustrating the electric characteristic thereof at and near a resonance point of the resonator.

As shown in FIG. 4, the equivalent circuit is formed by a serial circuit of a capacitance C1, a resistance R and an inductance L in series, and a capacitance C2 connected in parallel to them.

Figure 5:
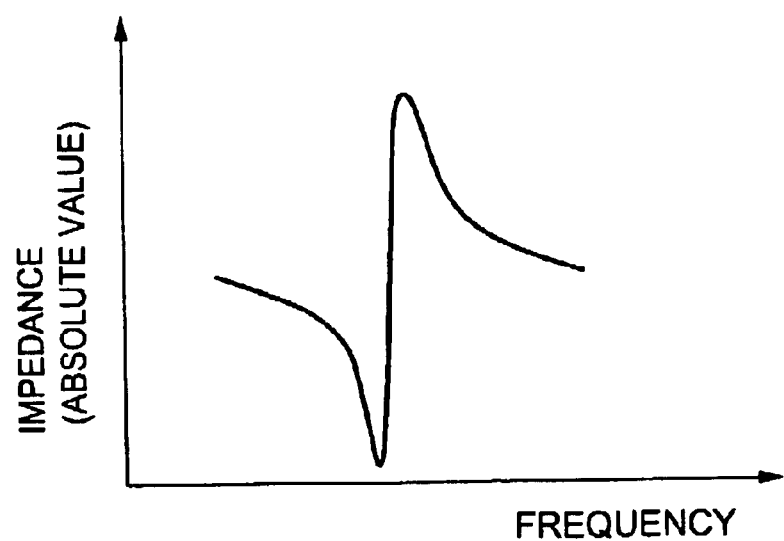
FIG. 5 is a graph illustrating the frequency characteristics of a thin film piezoelectric resonator adapted to utilize a bulk acoustic wave.

FIG. 5 illustrates the frequency dependency of the absolute value of the impedance of the equivalent circuit of FIG. 4.

Referring to FIG. 5, the equivalent circuit, or any of the thin film piezoelectric resonators illustrated in one of the FIGS. 1 through 3 has a minimal point (resonance frequency) and a maximal point (anti-resonance frequency).

Now, the structure and the characteristics of a switching filter realized by using a thin film piezoelectric resonator that operates with such a characteristic aspect will be described by referring to FIGS. 6(a) and 6(b).

Figure 6A:
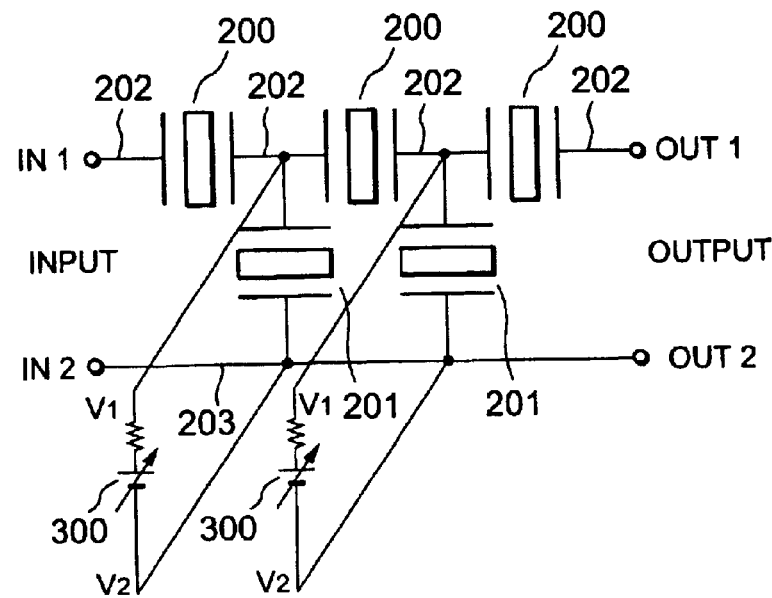
FIG. 6($a$) is a circuit diagram of an embodiment of switching filter according to the present invention and FIG. 6($b$) is a graph illustrating the frequency characteristics of the absolute value of the impedance of the switching filter of FIG. 6($a$).
Figure 6B:
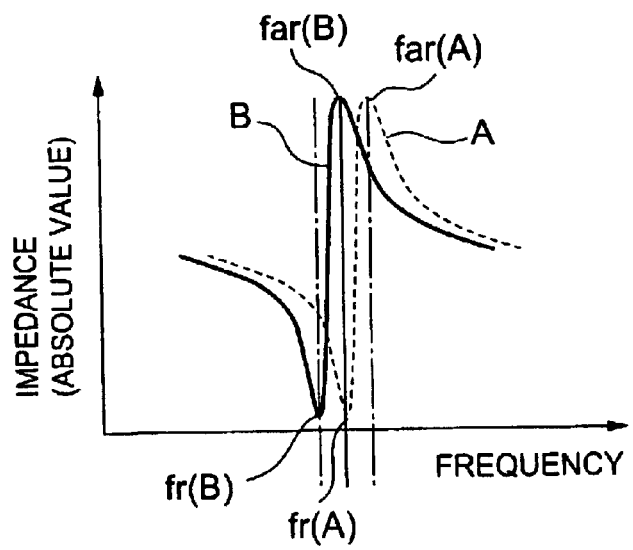

FIG. 6(a) is a circuit diagram of an embodiment of switching filter according to the present invention and realized by using such thin film piezoelectric resonators for the switching filter and FIG. 6(b) is a graph illustrating the frequency characteristics of the serial and parallel resonators of the filter circuit of FIG. 6(a).

As shown in FIG. 6(a), the switching filter comprises input nodes (In1, In2), e.g., input terminals and output nodes (Out1, Out2), e.g., output terminals for high frequency signals. A first conductor (line) 202 is connected between the first input/output nodes (In1, Out1) and a plurality of thin film resonators 200 are connected in series by the first conductor 202. Variable voltage sources containing DC power source 300 are connected to each of thin film piezoelectric resonators 201 between the first and the second lines 202,203.

Similarly, a second conductor 203 is connected between the second input/output nodes (In2, Out2) as bus line and a plurality of thin film piezoelectric resonators 201 are connected in parallel between the second conductor 203 and the first conductor 202.

FIG. 6(b) is a graph showing the relationship between the frequency and the absolute of the thin film piezoelectric resonator 200 connected in series, which is referred to as resonance frequency characteristic A and that of the thin film piezoelectric resonator 201 connected in parallel, which is referred to as resonance frequency characteristic B.

As seen from FIG. 6(b), the thin film piezoelectric resonator 200 connected in series and the thin film piezoelectric resonator 201 connected in parallel are selected such that the absolute values of the impedances of the thin film piezoelectric resonator 200 connected in series and the thin film piezoelectric electric resonator 201 connected in parallel show substantially the same profile. However, the resonance frequency characteristic A of the thin film piezoelectric resonator 200 connected in series is slightly shifted to the higher frequency side, in comparison to the resonance frequency characteristic B of the thin film piezoelectric resonator 201 connected in parallel.

Note that the resonance frequency fr(A) of the thin film piezoelectric resonator 200 connected in series is made to coincide with the anti-resonance frequency far(B) of the thin film piezoelectric resonator 201 connected in parallel. The resonance frequency of a thin film piezoelectric resonator can be shifted typically by modifying the film thickness of the piezoelectric film or the film thickness of the electrodes.

Figure 7:
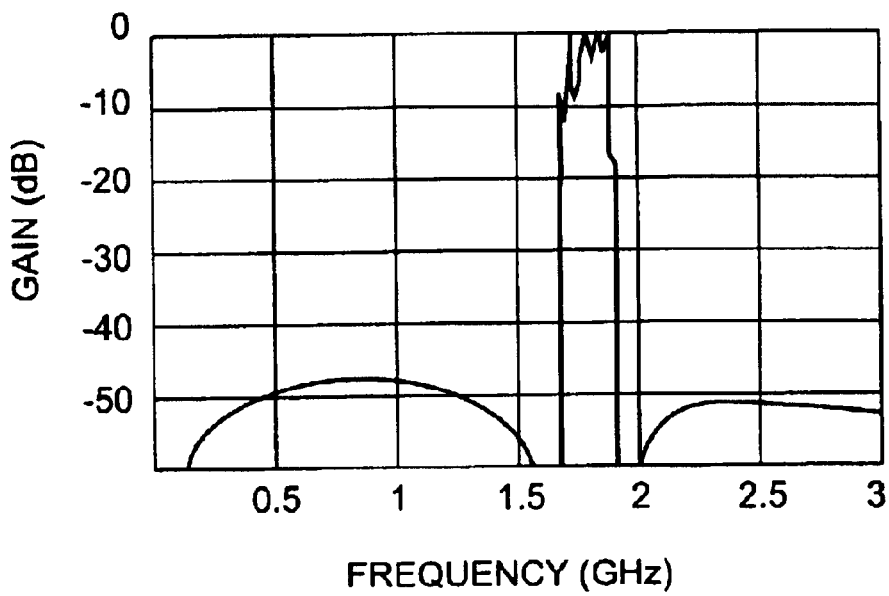
FIG. 7 is a graph illustrating an example of band pass-gain of the embodiment of switching filter of FIG. 6 that can be used for the purpose of the invention.

FIG. 7 is a graph showing the synthesized impedance of the thin film piezoelectric resonator 200 connected in series and the thin film piezoelectric resonator 201 connected in parallel.

As seen from FIG. 7, the synthesized impedance shows a band pass characteristic of having a peak between 1.7 GHz and 1.9 GHz. Due to this characteristic, it is possible to filter a wave having a certain frequency band.

Then, the resonance frequency fr(A) of the thin film piezoelectric resonator 200 connected in series is made to coincide with the resonance frequency fr(B) of the thin film piezoelectric resonator 201 connected in parallel by applying a voltage from a DC power source 300 at least to the opposite ends of either the thin film piezoelectric resonator 200 connected in series or the thin film piezoelectric resonator 201 connected in parallel. Then, the anti-resonance frequency far(A) of the thin film piezoelectric resonator 200 connected in series is automatically made to be substantially coincident with the anti-resonance frequency far(B) of the thin film piezoelectric resonator 201 connected in parallel.

Figure 8:
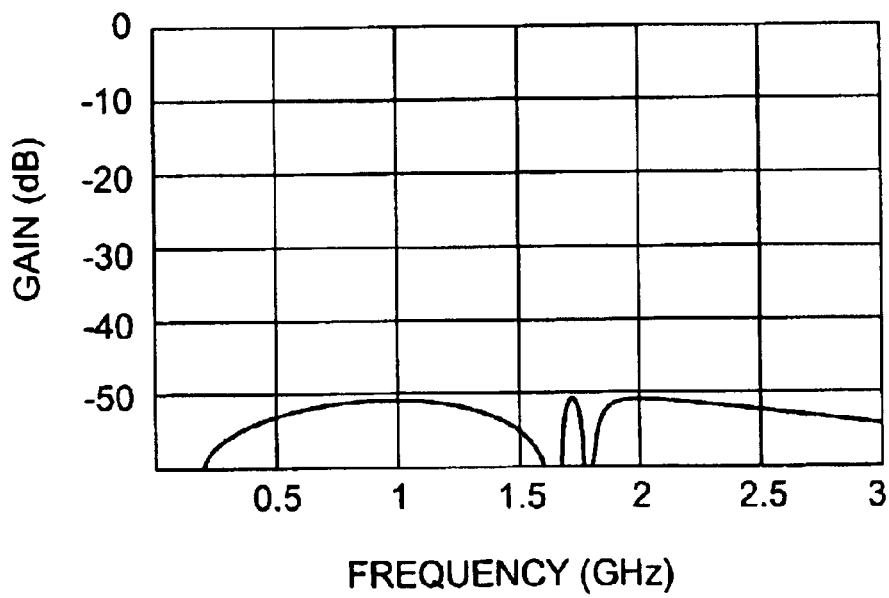
FIG. 8 is a graph illustrating an example of all block characteristic the embodiment of switching filter of FIG. 6 that can be used for the purpose of the invention.

FIG. 8 shows the pass characteristic of the filter obtained as a result of the above regulating process.

As seen from FIG. 8, the pass characteristic of the filter shows a block effect substantially over the entire frequency range.

Thus, according to the invention, there is provided a switching filter having a simple configuration that can switch from the band pass characteristic obtained when the resonance frequency fr(A) of the thin film piezoelectric resonator 200 connected in series and the anti-resonance frequency far(B) of the thin film piezoelectric resonator 201 connected in parallel are made to coincide with each other to the all block characteristic obtained when the resonance frequency fr(A) of the thin film piezoelectric resonator 200 connected in series and the resonance frequency fr(B) of the thin film piezoelectric resonator 201 connected in parallel are made to coincide with each other or vice versa by applying a voltage.

While the characteristic of the thin film piezoelectric resonator connected in series is shifted from that of the thin film piezoelectric resonator connected in parallel in the initial state where no voltage is applied in the above described instance, it is also possible to make the two characteristics shifted from each other by applying a voltage from a state where they coincide with each other.

A voltage may be applied either to the thin film piezoelectric resonator 200 connected in series or to the thin film piezoelectric resonator 201 connected in parallel to shift their characteristics relative to each other. Alternatively, a voltage may be applied to both of them to shift their characteristics relative to each other.

Thus, the present invention utilizes a phenomenon that the resonance frequency can be shifted when a DC bias voltage is applied to a piezoelectric film so as to change the polarized state and modify the piezoelectric constant, the elastic coefficient and other specific values. By using this effect, it is possible to switch from the all block characteristic, which is obtained by making the resonance characteristic of a thin film piezoelectric resonator 200 connected in series and that of a thin film piezoelectric resonator 201 connected in parallel coincide with each other, to the band pass characteristic, which is obtained by shifting the resonance characteristics relative to each other, simply by applying a DC bias voltage. Therefore, according to the invention, it is possible to provide a switching filter having a simple configuration.

Figure 9:
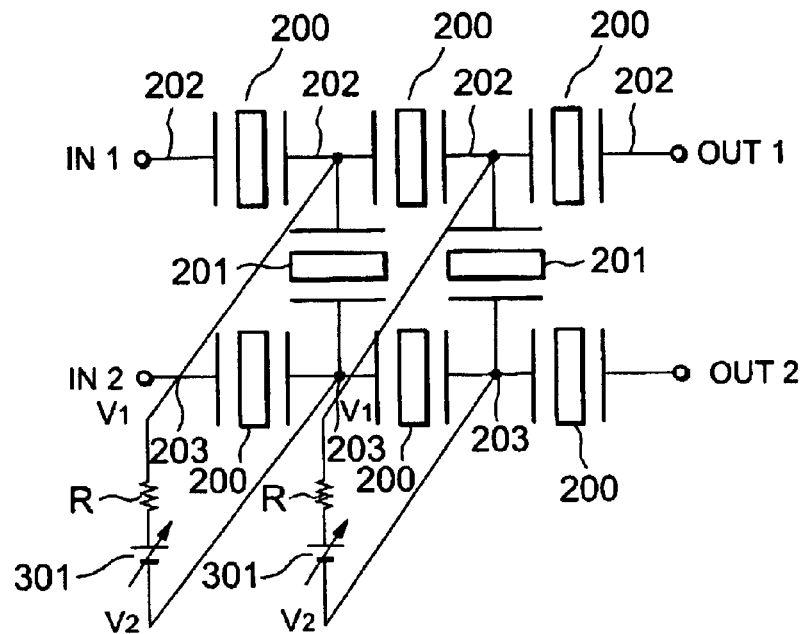
FIG. 9 is a circuit diagram of another embodiment of switching filter according to the present invention, which is a balanced ladder-type filter.
Figure 10:
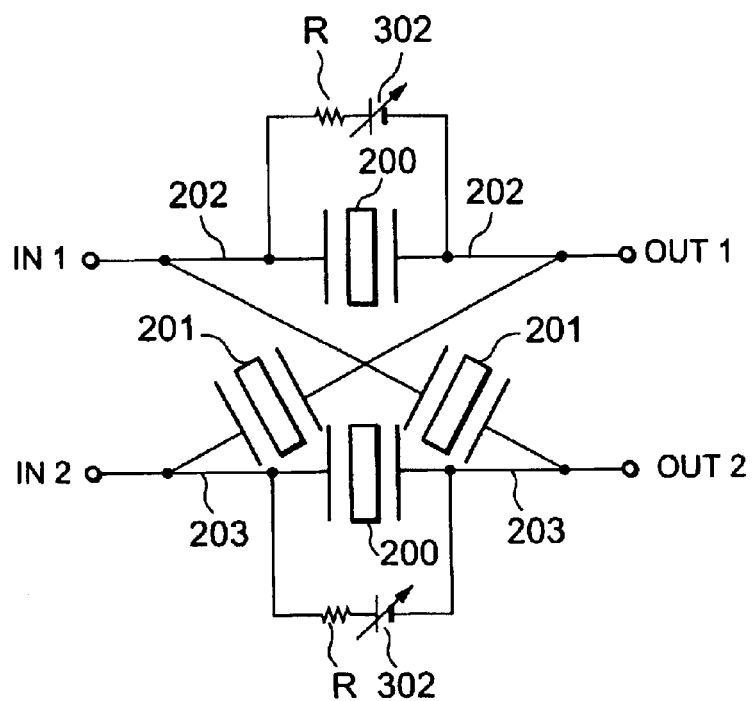
FIG. 10 is a circuit diagram of still another embodiment of switching filter according to the present invention, which is a balanced lattice-type filter.

The number of stages produced by thin film piezoelectric resonators of a switching filter according to the invention is not limited to those shown in FIGS. 6, 9 and 10 and may be increased in order to increase the out-of-band attenuation. Furthermore, the circuit configuration of the above described embodiment of switching filter according to the invention may be modified appropriately depending on the application thereof without departing from the scope of the invention.

Now, the modes of applying a DC bias voltage to thin film piezoelectric resonators of the above described type will be discussed below.

Assume that a variable voltage is applied to a balanced ladder-type filter having a three-stage series-connected section and a two-stage parallel-connected section is formed by using thin film piezoelectric resonators 200, 201, all of which comprise a ferroelectric thin film polarized only in the direction of the height thereof. Firstly, a mode of applying a voltage only to the thin film piezoelectric resonators 201 connected in parallel will be discussed.

At first glance, it may appear that it is sufficient to connect a variable DC voltage circuit 301 only to the opposite ends of the thin film piezoelectric resonators 201 that are connected in parallel in the entire circuit of FIG. 9. Then, however, the voltage is applied also to the thin film piezoelectric resonators 200 connected in series to change their resonance characteristic. In order to select either the band pass characteristic or the all rejection characteristic of the filter most efficiently, it is necessary to control the voltage to be applied to the thin film piezoelectric resonators 201 connected in parallel and the voltage to be applied to the thin film piezoelectric resonators 200 connected in series independently. Therefore, it is not desirable to change the characteristic of the thin film piezoelectric resonators 200 connected in series when applying a voltage to the thin film piezoelectric resonators 201 connected in parallel.

Figure 11:
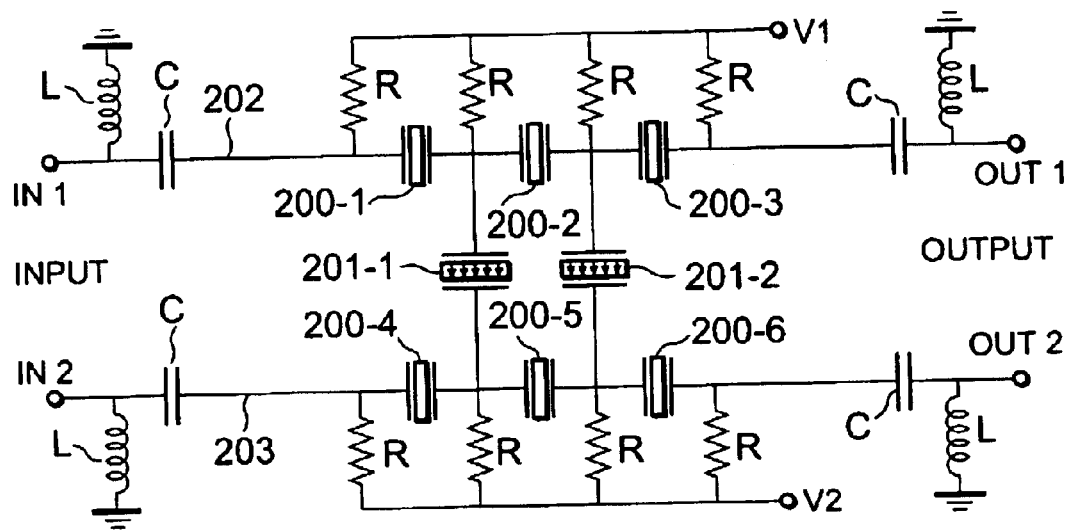
FIG. 11 is a detailed circuit diagram of the embodiment of FIG. 9.

This problem can be avoided by using a circuit configuration as shown in FIG. 11.

The ladder-type filter circuit shown in FIG. 11 comprises first input/output nodes (In1, Out1), second input/output nodes (In2, Out2), a first conductor 201 connecting the first input/output nodes (In1, Out1) and a second conductor 203 connecting the second input/output nodes (In2, Out2) along with first through third thin film piezoelectric resonators (200-1, 200-2, 200-3) connected in series by the first conductor 202, fourth through sixth thin film piezoelectric resonators (200-4, 200-5, 200-6) connected in series by the second conductor 203, a first thin film piezoelectric resonator 201-1 connected in parallel and having one of the nodes located between the first and second thin film piezoelectric resonators (200-1, 200-2) that are connected in series and the other node located between the fourth and fifth thin film piezoelectric resonators (200-4, 200-5) that are connected in series and a second thin film piezoelectric resonator 201-2 connected in parallel and having one of the nodes located between the second and third thin film piezoelectric resonators (200-2, 200-3) that are connected in series and the other node located between the fifth and sixth thin film piezoelectric resonators (200-5, 200-6) that are connected in series. Additionally, the first and second input/output nodes (In1, Out1, In2, Out2) are connected to respective matching circuits, each comprising a capacitance C and an inductance L. In FIG. 9, the thin film piezoelectric resonators 201-1, 201-2 that are connected in parallel are polarized from the positive pole toward the negative pole as indicated by an arrow.

In the above described three-stage balanced ladder-type filter circuit, a voltage can be applied only to the two thin film piezoelectric resonators (201-1, 201-2) connected in parallel by using circuit configurations as described below.

Firstly, the first and second thin film piezoelectric resonators (201-1, 201-2) that are connected in parallel are connected in such a way that both of their resonance frequencies rise (or fall) when a voltage is applied from the first conductor 202 toward the second conductor 203.

Then, one of the nodes, or the node V1, of the variable voltage source is connected between the first thin film piezoelectric resonator 200-1 connected in series and the first input node In1, between the first and second thin film piezoelectric resonators (200-1, 200-2) connected in series, between the second and third thin film piezoelectric resonators (200-2, 200-3) connected in series and between the third thin film piezoelectric resonator 200-3 connected in series and the first output node Out1 byway of a resistance R having an impedance sufficient for cutting off higher frequencies. Additionally, the other node V2 of the variable voltage source is connected between the fourth thin film piezoelectric resonator 200-4 connected in series and the second input node In2, between the fourth and fifth thin film piezoelectric resonators (200-4, 200-5) connected in series, between the fifth and sixth thin film piezoelectric resonators (200-5, 200-6) connected in series and between the sixth thin film piezoelectric resonator 200-6 connected in series and the second output node Out2 by way of a resistance R for cutting out higher frequencies.

With the above described voltage application mode, the variable voltage source is connected to all the thin film piezoelectric resonators 200 connected in series so that it is possible to apply a variable voltage (V1–V2) only to the thin film piezoelectric resonators 201 connected in parallel because a same voltage is applied to the opposite ends of each and every thin film piezoelectric resonators 200 connected in series and hence no substantial voltage is applied thereto.

Additionally, since matching circuits are connected respectively to the first and second input/output nodes (In1, Out1, In2, Out2), no DC voltage is applied to the outside of the ports.

Thus, it is possible to provide an ordinary filter circuit with a switching feature simply by adding a resistance element for cutting off high frequencies without changing the basic configuration of the filter when the variable voltage source is connected to the thin film piezoelectric resonators of the filter circuit in the above described mode. Therefore, the present invention is particularly advantageous from the industry point of view.

Now, a mode of applying a voltage only to the thin film piezoelectric resonators 200 connected in series of a balanced ladder-type filter will be described by referring to FIG. 12.

Figure 12:
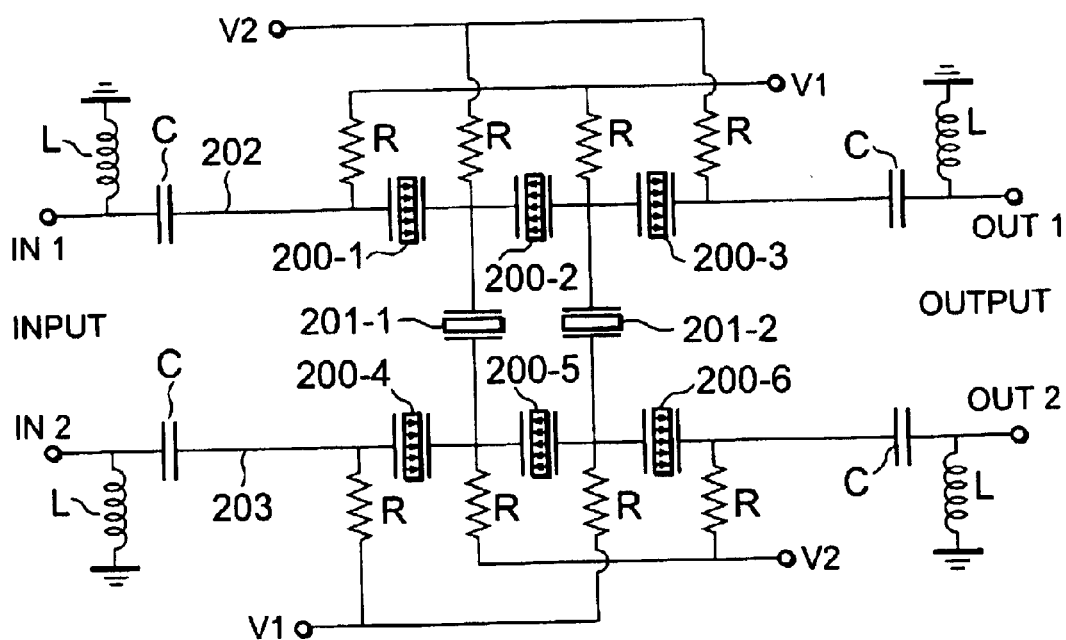
FIG. 12 is a circuit diagram of still another embodiment of switching filter according to the present invention, which is a balanced ladder-type filter.

As seen from FIG. 12, the switching filter is identical with the balanced ladder-type filter circuit shown in FIG. 11 as it comprises six thin film piezoelectric resonators 200 connected in series and two thin film piezoelectric resonators 201 connected in parallel and is provided with matching circuits formed by using capacitances C and resistances R.

This switching filter differs from that of FIG. 11 in terms of the connections to the variable voltage source V1–V2 and the "orientation" of the thin film piezoelectric resonators 200 connected in series. The differences will be described below. Note that the thin film piezoelectric resonators 200-1 through 200-6 that are connected in series are polarized from the positive pole toward the negative pole as indicated by an arrow in FIG. 12 and the resonance frequency rises as the voltage difference is raised, provided that V1>V2 is assumed.

Firstly, the first and third thin film piezoelectric resonators (200-1, 200-3) that are connected in series are connected in such a way that both of their resonance frequencies rise when a voltage is applied from the first input node In1 toward the first output node Out1 and the resonance frequency of the second thin film piezoelectric resonator 200-2 that is connected in series falls conversely when a voltage is applied from the first input node In1 toward the first output node Out1.

Then, the fourth and sixth thin film piezoelectric resonators (200-4, 200-6) that are connected in series are connected in such a way that both of their resonance frequencies rise when a voltage is applied from the second input node In2 toward the second output node Out2 and the resonance frequency of the fifth thin film piezoelectric resonator 200-5 that is connected in series falls conversely when a voltage is applied from the second input node In2 toward the second output node Out1.

Subsequently, one of the nodes, or the node V1, of the variable voltage source is connected between the first thin film piezoelectric resonator 200-1 connected in series and the first input node In1, between the second and third thin film piezoelectric resonators (200-2, 200-3) connected in series, between the fourth thin film piezoelectric resonator 200-4 connected in series and the second input node In2 and between the fifth and sixth thin film piezoelectric resonators (200-5, 200-6) connected in series by way of a resistance R having an impedance sufficient for cutting off higher frequencies.

Additionally, the other node V2 of the variable voltage source is connected between the first and second thin film piezoelectric resonators (200-1, 200-2) connected in series, between the third thin film piezoelectric resonator 200-3 connected in series and the first output node Out1, between the fourth and fifth thin film piezoelectric resonators (200-4, 200-5) connected in series and between the sixth thin film piezoelectric resonator 200-6 connected in series and the second output node Out2 by way of a resistance R for cutting out higher frequencies.

With the above described voltage application mode, it is possible to control only the voltage being applied to the thin film piezoelectric resonators 200 connected in series because the opposite ends of each and every thin film piezoelectric resonators 201 connected in parallel are constantly held to a same potential level.

Additionally, since matching circuits are connected respectively to the first and second input/output nodes (In1, Out1, In2, Out2), no DC voltage is applied to the outside of the ports.

Now, a mode of applying a voltage only to the thin film piezoelectric resonators connected in parallel of a balanced lattice-type filter from a variable DC power source will be described by referring to FIG. 10 and FIG. 13 respectively illustrating a schematic circuit diagram and a practical circuit.

The lattice-type filter circuit shown comprises first input/output nodes (In1, Out1), second input/output nodes (In2, Out2), a first conductor 201 connecting the first input/output nodes (In1, Out1) and a second conductor 203 connecting the second input/output nodes (In2, Out2) along with a first thin film piezoelectric resonator 200-1 connected in series to the first conductor 202, a second thin film piezoelectric resonator 200-2 connected in series to the second conductor 203, a first thin film piezoelectric resonator 201-1 connected in parallel between the first input node In1 and the second output node Out2 and a second thin film piezoelectric resonator 201-2 connected in parallel between the second input node In2 and the first output node Out1, the first and second thin film piezoelectric resonators connected in parallel being cross-connected. Additionally, the first and second input/output nodes (In1, Out1, In2, Out2) are connected to respective matching circuits, each comprising a capacitance C and an inductance L.

In the above described balanced lattice-type filter circuit, a voltage can be applied only to the two thin film piezoelectric resonators 201 connected in parallel by using circuit configurations as described below. Note that, in FIGS. 10 and 13, the thin film piezoelectric resonators 201-1, 201-2 that are connected in parallel are polarized from the positive pole toward the negative pole as indicated by an arrow. The transmission frequencies of these resonators rise as a voltage is applied in the direction indicated by an arrow.

Firstly, the first and second thin film piezoelectric resonators (201-1, 201-2) that are connected in parallel are connected in such a way that both of their resonance frequencies rise (or fall) when a voltage is applied from the first conductor 202 toward the second conductor 203. Then, one of the nodes, or the node V1, of the variable voltage source is connected between the first thin film piezoelectric resonator 200-1 connected in series and the first input node In1 and between the first thin film piezoelectric resonator 200-1 and the first output node Out1 by way of a resistance R having an impedance sufficient for cutting off higher frequencies.

Additionally, the other node V2 of the variable voltage source is connected between the second thin film piezoelectric resonator 200-2 connected in series and the second input node In2 and between the second thin film piezoelectric resonator 200-2 connected in series and the second output node Out2 by way of a resistance R for cutting out higher frequencies.

With the above described voltage application mode, it is possible to control only the voltage being applied to the thin film piezoelectric resonators 201 connected in parallel because the opposite ends of each of the thin film piezoelectric resonators 200 connected in series are constantly held to a same potential level, and hence no voltage is applied thereto.

Additionally, since matching circuits are connected respectively to the first and second input/output nodes (In1, Out1, In2, Out2), no DC voltage is applied to the outside of the ports.

Now, a mode of applying a voltage only to the thin film piezoelectric resonators connected in series of a balanced lattice-type filter will be described by referring to FIG. 14.

Figure 13:
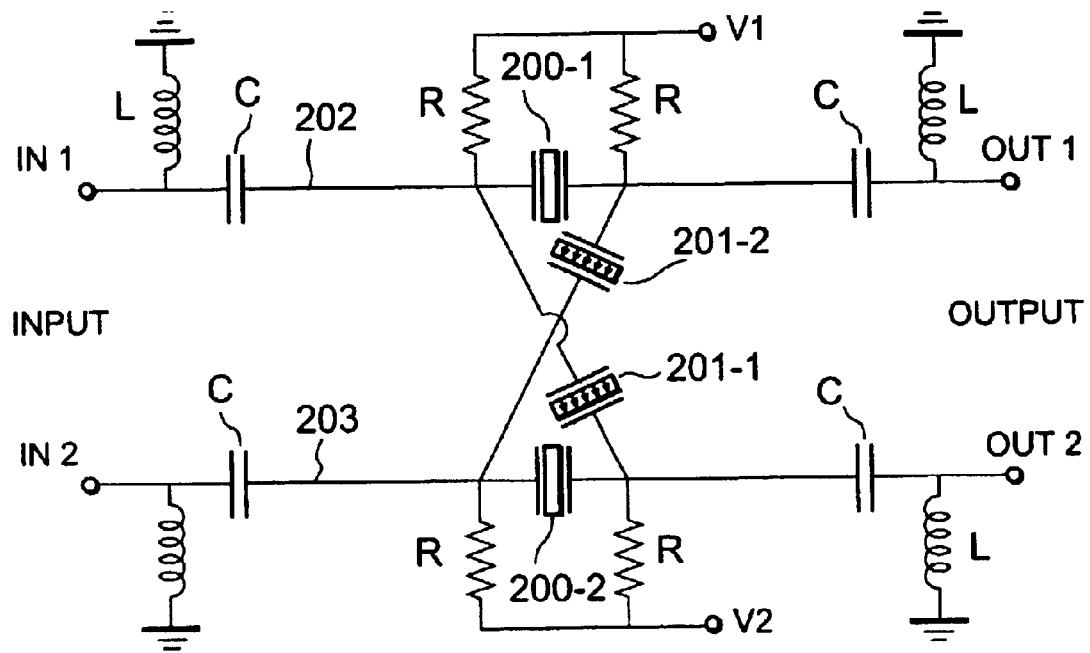
FIG. 13 is a detailed circuit diagram of the embodiment of FIG. 10.
Figure 14:
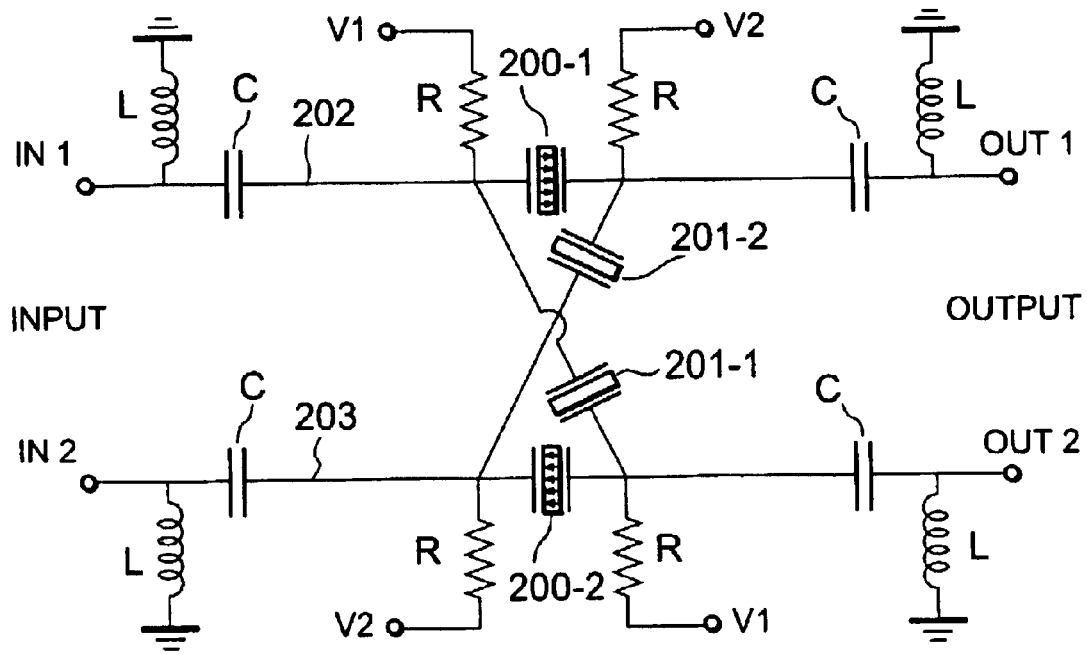
FIG. 14 is a circuit diagram of still another embodiment of switching filter according to the present invention, which is a balanced lattice-type filter.

As seen from FIG. 14, the switching filter is identical with the balanced lattice-type filter circuit shown in FIG. 13 as it comprises two thin film piezoelectric resonators 200 connected in series and two thin film piezoelectric resonators 201 connected in parallel and is provided with matching circuits formed by using capacitances C and resistances R.

This switching filter differs from that of FIG. 13 in terms of the connections to the variable voltage source and the "orientation" of the thin film piezoelectric resonators connected in series and those connected in parallel. The differences will be described below.

Firstly, the first thin film piezoelectric resonator 200-1 that is connected in series is connected in such a way that its resonance frequency rises when a voltage is applied from the first input node In1 toward the first output node Out1. Then, the second thin film piezoelectric resonator 200-2 that is connected in series is connected in such a way that its resonance frequency rises when a voltage is applied from the second output node Out2 toward the second input node In2.

Then, one of the nodes, or the node V1, of the variable voltage source is connected between the first thin film piezoelectric resonator 200-1 connected in series and the first input node In1 and between the second thin film piezoelectric resonator 200-2 connected in series and the second output node Out2 by way of a resistance R having an impedance sufficient for cutting off higher frequencies.

Additionally, the other node V2 of the variable voltage source is connected between the first thin film piezoelectric resonator 200-1 connected in series and the first output node Out1 and between the second thin film piezoelectric resonator 200-2 connected in series and the second input node In2 by way of a resistance R for cutting out higher frequencies.

With the above described voltage application mode, it is possible to control only the voltage being applied to the thin film piezoelectric resonators 200 connected in series because the opposite ends of each and every thin film piezoelectric resonators 201 connected in parallel are constantly held to a same potential level.

Additionally, since matching circuits are connected respectively to the first and second input/output nodes (In1, Out1, In2, Out2), no DC voltage is applied to the outside of the ports.

Figure 15:
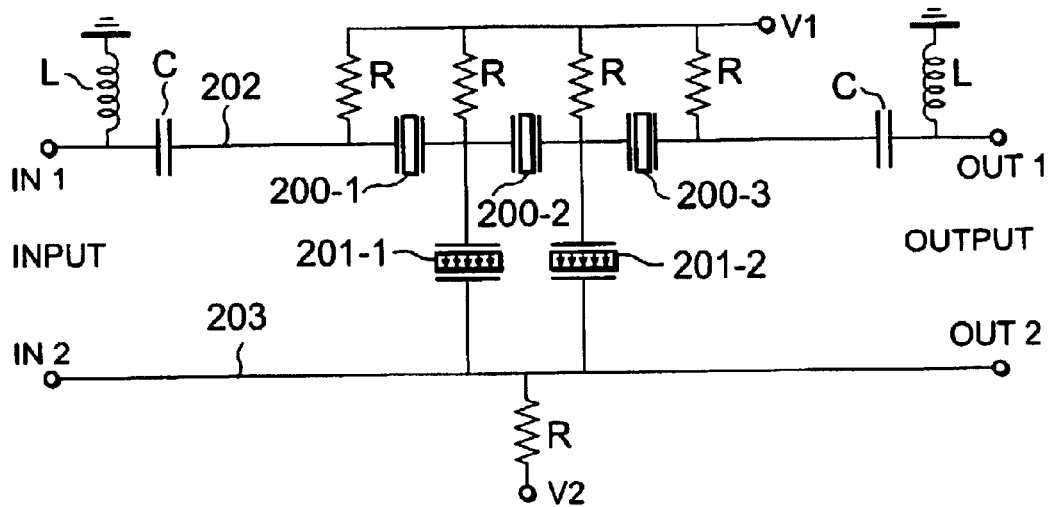
FIG. 15 is a circuit diagram of still another embodiment of switching filter according to the present invention, which is a balanced ladder-type filter.

Now, a mode of applying a voltage only to the thin film piezoelectric resonators connected in parallel of an unbalanced ladder-type filter as shown in FIG. 15 will be described.

Referring to FIG. 15, the switching filter comprises first input/output nodes (In1, Out1), second input/output nodes (In2, Out2), a first conductor 201 connecting the first input/output nodes (In1, Out1) and a second conductor 203 connecting the second input/output nodes (In2, Out2) along with first through third thin film piezoelectric resonators (200-1, 200-2, 200-3) connected in series by the first conductor 202, a first thin film piezoelectric resonator 201-1 connected in parallel and having one of the nodes connected between the first and second thin film piezoelectric resonators (200-1, 200-2) that are connected in series and the other node connected to the second conductor 203 and a second thin film piezoelectric resonator 201-2 connected in parallel and having one of the nodes connected between the second and third thin film piezoelectric resonators (200-2, 200-3) that are connected in series and the other node connected to the second conductor 203. Additionally, the first and second input/output nodes (In1, Out1, In2, Out2) are connected to respective matching circuits, each comprising a capacitance C and an inductance L.

In the above described unbalanced ladder-type filter circuit, a voltage can be applied only to the two thin film piezoelectric resonators 201 connected in parallel by using circuit configurations as described below.

Firstly, the first and second thin film piezoelectric resonators (201-1, 201-2) that are connected in parallel are connected in such a way that both of their resonance frequencies rise (or fall) when a voltage is applied from the first conductor 202 toward the second conductor 203.

Then, one of the nodes, or the node V1, of the variable voltage source is connected between the first thin film piezoelectric resonator 200-1 connected in series and the first input node In1, between the first and second thin film piezoelectric resonators (200-1, 2002) connected in series, between the second and third thin film piezoelectric resonators (200-2, 200-3) connected in series and between the third thin film piezoelectric resonator 200-3 connected in series and the first output node Out1 by way of a resistance R having an impedance sufficient for cutting off higher frequencies.

Additionally, the other node V2 of the variable voltage source is connected between the second input node In2 and the second output node Out2 by way of a resistance R for cutting out higher frequencies.

With the above described voltage application mode, it is possible to control only the voltage being applied to the thin film piezoelectric resonators 201 connected in parallel because the opposite ends of each and every thin film piezoelectric resonators 200 connected in series are constantly held to a same potential level.

Additionally, since matching circuits are connected respectively to the first and second input/output nodes (In1, Out1, In2, Out2), no DC voltage is applied to the outside of the ports.

Figure 16:
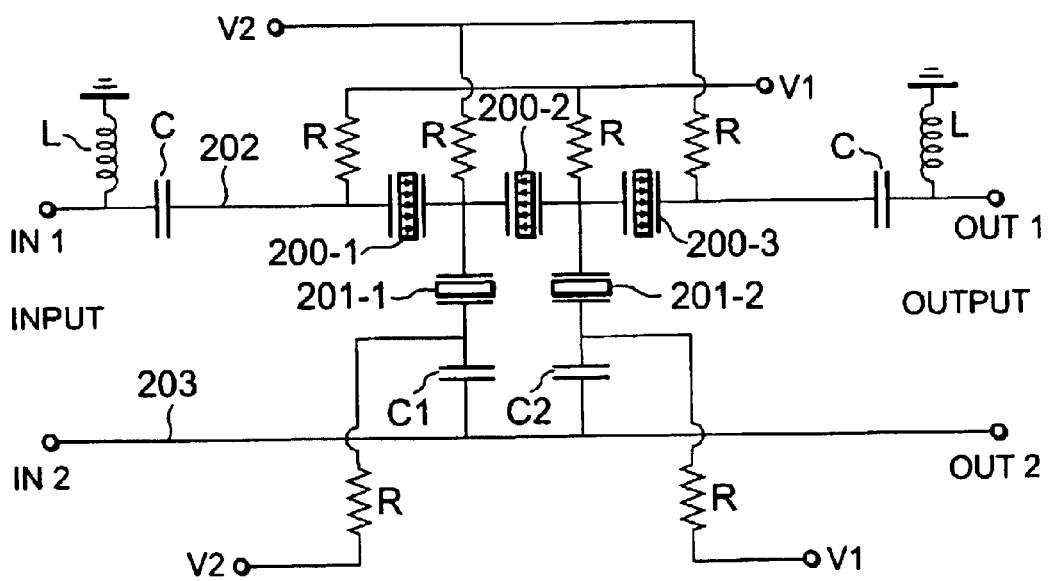
FIG. 16 is a circuit diagram of still another embodiment of switching filter according to the present invention, which is also a balanced ladder-type filter.

Now, a mode of applying a voltage only to the thin film piezoelectric resonators connected in parallel of an unbalanced ladder-type filter as shown in FIG. 16 will be described.

Referring to FIG. 16, this switching filter comprises three thin film piezoelectric resonators 200 connected in series and two thin film piezoelectric resonators 201 connected in parallel along with matching circuits, each comprising a capacitance C and an inductance L, as in the case of the unbalanced ladder-type filter circuit of FIG. 15.

This switching filter differs from that of FIG. 15 in terms of the connections to the variable voltage source, the "orientation" of the thin film piezoelectric resonators 200 connected in series, or the direction in which the resonance frequencies rise relative to the applied voltage, and the two capacitors for blocking the DC voltage. The differences will be discussed below.

Firstly, the first and third thin film piezoelectric resonators (201-1, 201-3) that are connected in series are connected in such a way that both of their resonance frequencies rise (or fall) when a voltage is applied from the first input node In1 toward the first output node Out1.

Then, the second thin film piezoelectric resonator 200-2 that is connected in series is connected in such a way that its resonance frequency rises when a voltage is applied from the first output node Out1 toward the first input node In1.

Furthermore, in order to block the DC voltage, the first capacitor C1 is inserted between the first thin film piezoelectric resonator 201-1 connected in parallel and the second conductor 203, while the second capacitor C2 is inserted between the second thin film piezoelectric resonator 201-2 connected in parallel and the second conductor 203.

Additionally, one of the nodes, or the node V1, of the variable voltage source is connected between the first thin film piezoelectric resonator 200-1 connected in series and the first input node In1, between the second and third thin film piezoelectric resonators (200-2, 200-3) connected in series, between the second and third thin film piezoelectric resonators (200-2, 200-3) connected in series and between the second thin film piezoelectric resonator 200-2 connected in series and the second capacitor C2 by way of a resistance R having an impedance sufficient for cutting off higher frequencies.

Furthermore, the other node V2 of the variable voltage source is connected between the first and second thin film piezoelectric resonators (200-1, 200-2) connected in series, between the third thin film piezoelectric resonator 200-3 connected in series and the first output node Out1 and between the first thin film piezoelectric resonator 200-1 connected in series and the first capacitor C1 by way of a resistance R for cutting out higher frequencies.

With the above described voltage application mode, it is possible to control only the voltage being applied to the thin film piezoelectric resonators 200 connected in series because the opposite ends of each and every thin film piezoelectric resonators 201 connected in parallel are constantly held to a same potential level.

Additionally, since matching circuits, each comprising a capacitance C and an inductance L, are connected respectively to the first input/output nodes (In1, Out1) and the first and second capacitors (C1, C2) are connected to the second conductor 203, no DC voltage is applied to the outside of the ports.

While piezoelectric materials that can suitably be used for thin film piezoelectric resonators for the purpose of the invention include AlN, ZnO, $PbTiO_3$, $BaTiO_3$ and $Pb(Zr,Ti)O_3$(PZT), the use of a material showing a high dielectric constant may be advantageous from the viewpoint of downsizing because such a material requires a minimal electrode area for impedance matching. The use of $BaTiO_3$ is particularly advantageous because the resonance frequency changes remarkably when a low voltage is applied.

Figure 17:
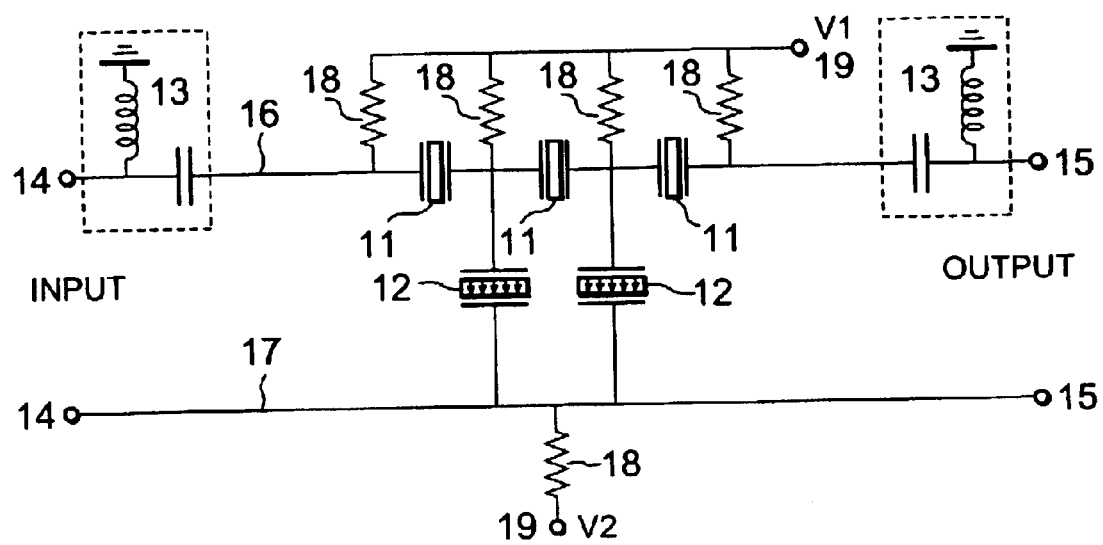
FIG. 17 is a circuit diagram of still another embodiment of switching filter according to the present invention, which is also a balanced ladder-type filter.

FIG. 17 shows a circuit diagram of a preferable embodiment of switching filter according to the invention and comprising a plurality of thin film piezoelectric resonators.

The illustrated circuit is an unbalanced ladder-type filter having a three-stage series-connected section and a two-stage parallel-connected section and comprising three thin film piezoelectric resonators connected in series and two thin film piezoelectric resonators connected in parallel. A variable voltage source is connected between all the thin film piezoelectric resonators connected in series and second conductor 17 so that a voltage may be applied in any desired direction. A resistance 18 is connected between the variable voltage source and the first conductor 16 and the second conductor 17 in order to block high frequency components.

The resistance may well have a value equal to 500 to 1,000 times of the largest value of the impedance of the anti-resonance frequency that maximizes the absolute value of the impedance of the thin film piezoelectric resonators. Typically, the resistance has a value between hundreds of several kΩ and several MΩ. If the resistance has too large a value the CR time constant that is defined in terms of the capacitance and the resistance of the thin film piezoelectric resonators becomes large and consequently prolongs the time required for switching operations. A matching circuit 15 is connected to the output/input nodes of the filter circuit and the characteristic impedance is regulated to the value required for the expected system.

All the series-connected and parallel-connected thin film piezoelectric resonators (11, 12) are made of a same material and show a same configuration. They show blocking characteristics as illustrated in FIG. 8 when no voltage is applied thereto. On the other hand, when a DC bias voltage is applied to the thin film piezoelectric resonators 12 connected in parallel in the direction effective for reducing the resonance frequency so as to make the anti-resonance frequency of the thin film piezoelectric resonators 12 connected in parallel and the resonance frequency of the thin film piezoelectric resonators 11 connected in series equal to each other, the circuit comes to show characteristics of a band pass filter having a center frequency equal to that frequency.

In an experiment, a specimen of thin film piezoelectric resonator to be used for forming the above described embodiment of filter was prepared in a manner as described below.

Figure 18A:
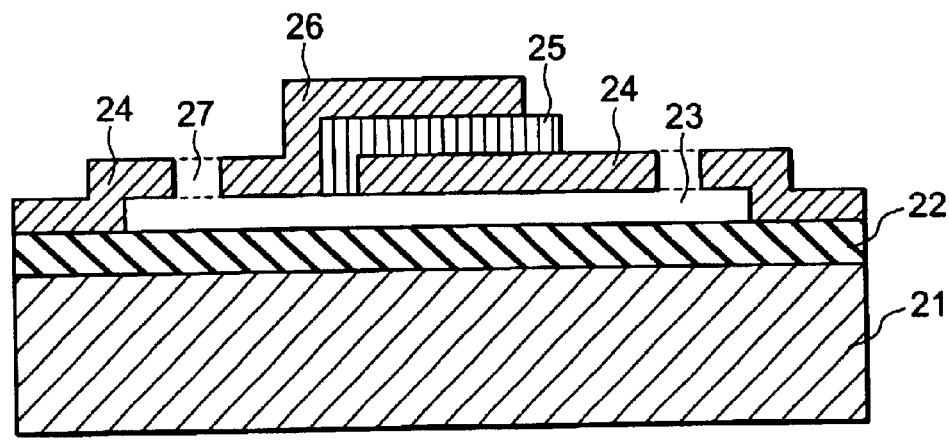
FIG. 18($a$) is a schematic cross sectional view of a thin film piezoelectric resonator formed by using a ferroelectric member adapted to utilize a bulk acoustic wave, illustrating the specific method of manufacturing the same.

Firstly, referring to FIG. 18(a), an Si substrate 21 was oxidized by a known oxidizing technique to produce a 600 nm thick $SiO_2$ layer 22. Then, a 300 nm thick sacrifice layer 23 of $SrRuO_3$ was formed thereon for the purpose of cavitation. The film forming conditions were such that the substrate temperature was 450° C. and the RF power was 300 W, while a 4-inch ceramic target was used in an argon and oxygen (Ar+$O_2$) atmosphere.

Thereafter, the $SrRuO_3$ sacrifice layer 23 was subjected to a patterning operation, using an etchant containing cerium-ammonium nitrite solution as principal ingredient. Then, a 100 nm thick first electrode 24 made of Ir(I) was formed thereon also by sputtering. After a patterning operation, it was subjected to an Ar milling process.

Thereafter, a piezoelectric film 25 of $BaTi_3$ was formed by sputtering. The film forming conditions were such that the substrate temperature was 450° C. and the RF power was 300 W, while a plurality of targets were used in order to raise the film forming rate. The film forming operation was conducted in an argon and oxygen (Ar+$O_2$) atmosphere. The piezoelectric film 25 was made to have a film thickness of 800 nm.

After patterning the piezoelectric film 25, it was subjected to a wet etching operation, using an etchant containing hydrogen peroxide as principal ingredient. Thereafter, a 100 nm thick second electrode 26 made of Ir was formed under the film forming conditions same as those used for the forming the first electrode.

Subsequently, after patterning the second electrode 26, it was subjected to an Ar milling process. After the completion of the process of forming all the layers, the $SrRuO_3$ sacrifice layer 23 was dissolved by using an etchant containing cerium-ammonium nitrite solution as principal ingredient through the via hole 27 that had been formed in a preceding process for the purpose of cavitation. The c-axis of the obtained ferroelectric film that indicates the direction of polarization showed an orientation full width at half maximum of 0.3°.

Figure 18B:
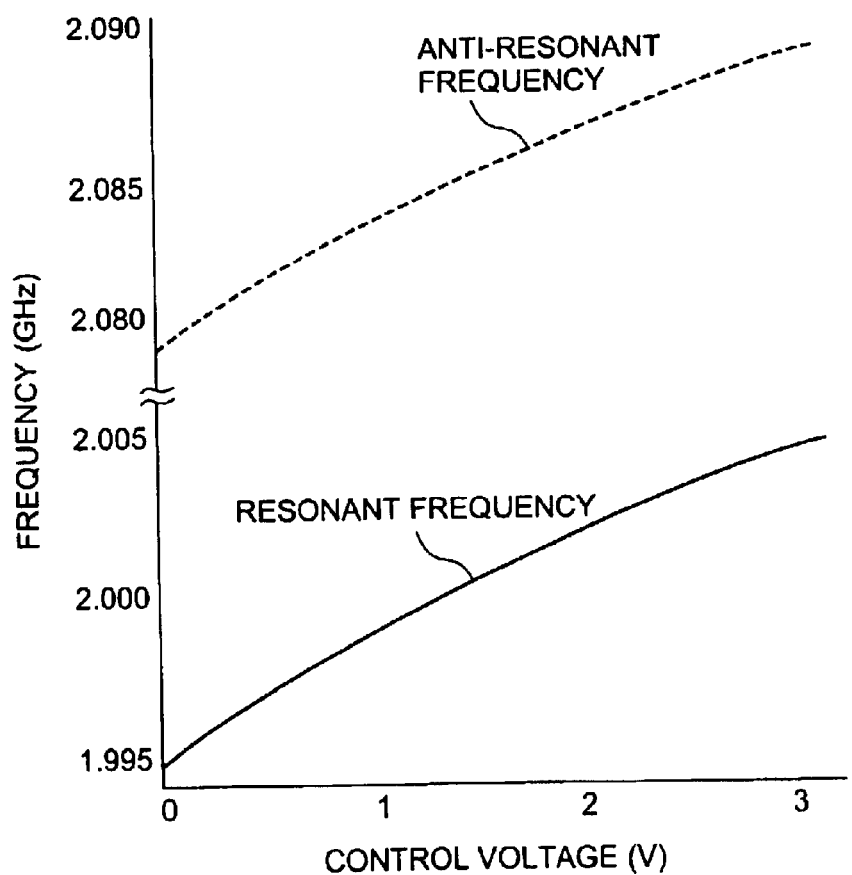

The electric characteristics of the thin film piezoelectric resonator prepared in a manner as described above was observed by means of a network analyzer to find that both its resonance frequency and its anti-resonance frequency were close to 2 GHz and its electromechanical coupling coefficient was about 17%, whereas its Q value as 800, as shown in FIG. 18(b). A DC voltage that was variable between 0 and 3 V was applied between the electrodes to find that both the resonance frequency and the anti-resonance frequency had changed by about 100 MHz.

Then, a number of thin film piezoelectric resonators same as the above described one were prepared on a same Si substrate and all the other components including thin film resistors and capacitors and inductors to be used for matching circuits were also prepared on the same substrate by using thin film techniques.

The prepared thin film elements were connected by lines to produce a switching filter circuit as shown in FIG. 17. Since all the series-connected and parallel-connected thin film piezoelectric resonators had a same configuration, the circuit showed an all block characteristic as shown in FIG. 8 when no DC bias voltage is applied thereto. On the other hand, the circuit showed a band pass characteristic as shown in FIG. 7 when a DC bias voltage is applied only to the thin film piezoelectric resonators 12 connected in parallel to reduce the resonance frequency.

The circuit showed the best band pass filtering characteristic when the applied DC bias voltage was equal to 2.5 V.

Subsequently, an antenna was brought in and a plurality of switching filters same as the one described above by referring to FIG. 17 were connected to the antenna. The switching filters were made to filter respective frequency bands that are different from each other. Then, the switching filters were connected respectively to a plurality of frequency processing systems that correspond to the different frequency bands to produce a radio device adapted to accommodate a multi-band system.

The prepared multi-band radio system showed attenuations that were lower by about 1.5 dB in average than those observed when a conventional antenna switch was used.

Thus, according to the invention, the band pass characteristics and the all block characteristics can be selectively used by means of a variable voltage source having a simple configuration to eliminate interferences in a multi-band system, those of transmission/reception signals and undesired noises.

(Embodiment 2)

This embodiment is a high frequency filter having a variable center frequency, which will be described by referring to FIGS. 19 and 20(a) through 20(d).

The thin film piezoelectric resonators of this embodiment can be prepared in a manner as described above for the first embodiment.

Referring to FIG. 20(a), in this embodiment of high frequency filter, the resonance frequency fr(A) of the thin film piezoelectric resonators connected in series and the anti-resonance frequency far(B) of the thin film piezoelectric resonators connected in parallel are made to coincide with each other when no voltage is applied. Then, the filter shows a pass band centered at a certain frequency f0 as seen from in FIG. 20(c). As a control voltage is applied, both the resonance frequency fr(A) of the thin film piezoelectric resonators connected in series and the anti-resonance frequency far(B) of the thin film piezoelectric resonators connected in parallel are raised or dropped by $\Delta f$. In this way, the center frequency f0 of the pass band is caused to shift as shown in FIG. 20D.

The resonance frequency fr(A) of the thin film piezoelectric resonators connected in series and the anti-resonance frequency far(B) of the thin film piezoelectric resonator connected in parallel are caused to coincide with each other when a voltage is applied. Then, the filter shows a pass band centered at a certain frequency. As the control voltage is modified or no control voltage is applied, both the resonance frequency fr(A) and the anti-resonance frequency far(B) are raised or dropped. Again, in this way, the center frequency of the pass band is caused to change.

Normally, a portable node for mobile communications adapted to accommodate a multi-band system needs to be provided with signal receiving systems having respective band pass filters for the frequency bands that the node can use. To the contrary, a portable node for mobile communications adapted to accommodate a multi-band system and provided with a single filter circuit can be realized by using this embodiment provided with a band pass filter whose center frequency is variable.

FIG. 19 shows a circuit diagram of this embodiment of high frequency filter having a variable center frequency, which is a balanced lattice-type filter.

As shown in FIG. 19, a thin film piezoelectric resonator 11 is connected in series on a first conductor 16 and another thin film piezoelectric resonator 11 is connected in series on a second conductor 17, while a pair of thin film piezoelectric resonators are connected in parallel between the first conductor 16 and the second conductor 17 in the variable center frequency type filter.

A control voltage input node 13 is connected between the input node 14 and the thin film piezoelectric resonator 11 connected in series on the first conductor 16. Similarly, another control voltage input node 13 for applying a control voltage Vc is connected between the input node and the thin film piezoelectric resonator 11 connected in series on the second conductor 17.

The principle of operation of this variable center frequency type high frequency filter will described by referring to FIGS. 20(a) through 20(d).

FIG. 20(a) shows the resonance characteristic curve of the thin film piezoelectric resonators 11 connected in series and that of the thin film piezoelectric resonators 12 connected in parallel when no voltage is applied.

As shown in FIG. 20(a), the resonators are combined in such a way that the resonance frequency fr(A) (bottom) of the thin film piezoelectric resonators 11 connected in series (characteristic curve A) coincides with the anti-resonance frequency far(B) (top) of the thin film piezoelectric resonators 12 connected in parallel (characteristic curve B).

FIG. 20(c) shows the band pass characteristic curve of the filter when no voltage is applied thereto.

As seen from FIG. 20(c), the filter operates as a band pass filter whose center frequency is equal to f0 when no voltage is applied thereto.

Then, a negative voltage is applied to the control voltage input node 13 of the circuit of FIG. 19. A same voltage is applied to all of the thin film piezoelectric resonators 11 connected in series and the thin film piezoelectric resonators 12 connected in parallel in a direction opposite to the direction of polarization (as indicated by an arrow in FIG. 19). To the contrary, when a positive voltage is applied to the control voltage input node 13, a same voltage is applied to all of the thin film piezoelectric resonators 11 connected in series and the thin film piezoelectric resonators 12 connected in parallel in the direction of polarization.

As the voltage is applied, the elastic coefficient rises. Then, both the resonance frequency fr(A) of the thin film piezoelectric resonators 11 connected in series and the resonance frequency fr(B) of the thin film piezoelectric resonators 12 connected in parallel is raised by $\Delta f$. The voltage is so controlled that the resonance frequency fr(A) of the thin film piezoelectric resonators 11 connected in series and the anti-resonance frequency far(B) of the thin film piezoelectric resonators 12 connected in parallel keep their agreement while they are shifted.

Due to this arrangement, the filter is made to show a band pass characteristic with a center frequency of f0+$\Delta f$ as shown if FIG. 20(d). In other words, as the voltage is applied, the pass band of the filter is shifted by $\Delta f$ to the higher frequency side from the pass band of the filter when no voltage is applied thereto.

As a typical example, when the thin film piezoelectric resonators 11 connected in series and the thin film piezoelectric resonators 12 connected in parallel are made of a 1 $\mu$m thick barium titanate thin film and a voltage of 3V is applied to them, a ratio of change of about 2% is produced for the resonance frequency.

This embodiment, which is a variable center frequency type filter, can be used as RF top filter of a system having operation frequency bands that are close to each other such as GSM1.8G and GSM1.9G.

Conventionally, two RF filters are needed for such a system. To the contrary, a same system can be realized by using only a single variable center frequency type filter according to the invention and comprising small thin film piezoelectric resonators. Thus, the reception circuit of the system can be remarkably down-sized to exploit the advantages of the present invention.

(Embodiment 3)

This embodiment is a high frequency filter adapted to change its pass frequency band width, which will be described below by referring to FIGS. 21 and 22(a) through 22(d). The thin film piezoelectric resonators of this embodiment can be prepared in a manner as described above for the first embodiment.

Referring to FIG. 22(a), in this embodiment of high frequency filter, the resonance frequency fr(A) of the thin film piezoelectric resonators connected in series (characteristic curve A) and the anti-resonance frequency far(B) of the thin film piezoelectric resonators connected in parallel (characteristic curve B) are made to coincide with each other when no voltage is applied. Then, the gap between the resonance frequency fr(A) and the anti-resonance frequency far(B) can be modified by applying a control voltage at least either to the thin film piezoelectric resonators connected in series or to the thin film piezoelectric resonators connected in parallel. If the resonance frequency fr(A) of the thin film piezoelectric resonators connected in series and the anti-resonance frequency far(B) of the thin film piezoelectric resonators connected in parallel remain in a state where they substantially coincide with each other, only the band width can be modified without shifting the center frequency of the filter.

The electro-mechanical coupling coefficient of ferroelectric thin film is raised to consequently broaden the gap between the resonance frequency and the anti-resonance frequency by applying the voltage in the direction of boosting the polarization of the ferroelectric thin film. Therefore, it is possible to broaden the pass band width of the band pass filter.

As a voltage is applied in the direction of boosting the polarization, the elastic coefficient is also modified to shift the resonance frequency. Therefore, as the band width is changed, the center frequency of the filter shifts.

However, this problem can be minimized by using a ferroelectric material whose elastic coefficient depends on the applied voltage only slightly if compared with the voltage dependency of the piezoelectric constant. For example, it is preferable to use a ferroelectric film whose orientation shows disorder to a slight extent. It should be noted, however, if the orientation full width at half maximum is too large, the electro-mechanical coupling coefficient does not increase sufficiently when a voltage is applied to the filter and, therefore, the orientation full width at half maximum is preferably not greater than 0.5°. It is also preferable to use an epitaxially grown film for the ferroelectric film.

In this way, it is possible to make the band width variable by using a voltage range that can boost the change in the piezoelectricity when a uniform polarization is realized but disregard any change in the frequency if a voltage is applied.

Now, the embodiment, which is a variable band width type filter adapted to change the width of the pass frequency band, will be described by referring to FIG. 21.

As shown in FIG. 21, two thin film piezoelectric resonators 11-1, 11-2 are connected in series on first conductor 16 and another pair of thin film piezoelectric resonators 11-3, 11-4 are connected in series on second conductor 17 in this variable band width type filter. A total of four thin film piezoelectric resonators 12 are connected in parallel between the first conductor 16 and the second conductor 17.

A control voltage input node 13 is connected between the thin film piezoelectric resonator 11-1 connected in series and the thin film piezoelectric resonator 11-2 connected in series. Similarly, another control voltage input node 13 is connected between the thin film piezoelectric resonator 11-3 connected in series and the thin film piezoelectric resonator 11-4 connected in series.

The principle of operation of this variable band width type filter will be described by referring to FIGS. 22(a) through 22(d).

FIG. 22(a) shows the frequency characteristic curve A of the thin film piezoelectric resonators 11 connected in series and the frequency characteristic curve B of the thin film piezoelectric resonators 12 connected in parallel when no voltage is applied.

As seen from FIG. 22(a), the resonators are combined in such a way that the resonance frequency fr(A) (bottom) of the thin film piezoelectric resonators 11 connected in series (characteristic curve A) coincides with the anti-resonance frequency far(B) (top) of the thin film piezoelectric resonators 12 connected in parallel (characteristic curve B). Note that the gap separating the bottom of the anti-resonance frequency of the thin film piezoelectric resonators 11 connected in series and that of the anti-resonance frequency of the thin film piezoelectric resonators 12 connected in parallel is equal to $\Delta f/2$.

FIG. 20(c) shows the band pass characteristic of the filter when no voltage is applied thereto.

As seen from FIG. 20(c), the filter operates as a band pass filter whose pass band width is equal to $\Delta f$ when no voltage is applied thereto.

Then, a voltage is applied to the control voltage input node 13 of the circuit of FIG. 21. A same voltage is applied to all of the thin film piezoelectric resonators 11 connected in series and the thin film piezoelectric resonators 12 connected in parallel in the direction of polarization of the ferroelectric members.

While the ferroelectric films show a slightly disordered polarization when no voltage is applied thereto, they come to be polarized in a same direction to consequently increase the coupling coefficient.

As a result, the gap separating the anti-resonance frequencies far(A) and far(B) of the thin film piezoelectric resonators 11 connected in series and the thin film piezoelectric resonators 12 connected in parallel is increased as shown in FIG. 22(b). Note that the gap separating the resonance frequencies fr(A) and fr(B) of the thin film piezoelectric resonators 11 connected in series and the thin film piezoelectric resonators 12 connected in parallel is also increased. The voltage is so controlled that the resonance frequency fr(A) of the thin film piezoelectric resonators 11 connected in series and the anti-resonance frequency far(B) of the thin film piezoelectric resonators 12 connected in parallel keep their agreement while they are shifted.

While the resonance frequencies are also modified, it does not give rise to any substantial problem because the voltage dependency of the resonance frequencies is much greater than that of the coupling coefficient.

Due to this arrangement, the filter is made to show a band pass characteristic with a pass band width of $\Delta f + \Delta f'$ as shown if FIG. 20(d). In other words, as the voltage is applied, the pass band width of the filter is broadened by $\Delta f'$ from the pass band width of the filter when no voltage is applied thereto.

Thus, this embodiment of the invention operates as a band pass filter whose pass band width can be modified by applying a control voltage. Such a variable band width filter can advantageously be used for selecting a system out of a plurality of systems having respective operating band width that are different from each other or for a system adapted to change its band width depending on the volume of information to be handled (e.g., CDMA2000).

Thus, a variable band width type filter that can change its operating band width with a single filter circuit is highly useful in view of mobile communications in the future where the frequency band width will be required to be changed according to the volume of information to be transmitted.

(Embodiment 4)

This embodiment is a variable high frequency filter adapted to change its ripple profile and ripple position in the pass band, which will be described below by referring to FIGS. 23 and 24(a) through 24(d). The thin film piezoelectric resonators of this embodiment can be prepared in a manner as described above for the first embodiment.

Referring to FIG. 24(a), in this embodiment of variable filter, the resonance frequency fr(A) of the thin film piezoelectric resonators connected in series (characteristic curve A) and the anti-resonance frequency far(B) of the thin film piezoelectric resonators connected in parallel (characteristic curve B) are made to coincide with each other when no voltage is applied. Then, the filter shows a band characteristic of allowing signals of a certain frequency to pass through it. The gap between the resonance frequency fr(A) of the thin film piezoelectric resonators connected in series and the anti-resonance frequency far(B) of the thin film piezoelectric resonators connected in parallel can be modified by applying a control voltage at least either to the thin film piezoelectric resonators connected in series or to the thin film piezoelectric resonators connected in parallel. As a result, it is possible to change the ripple position and the ripple profile in the pass band.

When a voltage is applied, the resonance frequency fr(A) of the thin film piezoelectric resonators connected in series and the anti-resonance frequency far(B) of the thin film piezoelectric resonator connected in parallel are made to coincide with each other. Then, the filter shows a band characteristic of allowing signals of a certain frequency to pass through it. The gap between the resonance frequency fr(A) of the thin film piezoelectric resonators connected in series and the anti-resonance frequency far(B) of the thin film piezoelectric resonators connected in parallel can be modified by applying a control voltage at least either to the thin film piezoelectric resonators connected in series or to the thin film piezoelectric resonators connected in parallel. As a result, it is possible to change the ripple position and the ripple profile in the pass band.

With this arrangement, if a ripple is found in the pass band and there exists a band that shows an insertion loss partially greater than the system requirement, the filter operates properly, disregarding the existing slight ripple, because a control voltage is applied to the thin film piezoelectric resonators made of a ferroelectric material so as to reduce the insertion loss at least in the operating channel in the pass band in such a way that the resonance frequency of the thin film piezoelectric resonators connected in series is differentiated from the anti-resonance frequency of the thin film piezoelectric resonators connected in parallel and, when another channel is selected for communication, the control voltage is modified so as to produce a ripple profile that reduce the insertion loss of the newly selected operating channel.

Such a variable filter can show a slightly increased insertion loss when a material that improves the variable characteristics of the filter is used. However, as the ripple position and the ripple profile are made variable, materials that have hitherto been regarded to be unsuitable to filters can now be used for filters that are adapted to exploit the variability of the materials so that the scope of selection of materials is advantageously be broadened. Additionally, the minimal insertion loss can advantageously be reduced when resonators are combined in such a way that, at least in the operating channel, the insertion loss of the filter is made smaller than the minimal insertion loss produced by some other filter that is free from ripples and formed by using a material adapted to reduce the insertion loss if the material of the filter accompanies ripples.

Now, the embodiment, which is a variable filter adapted to change the ripple profile and the ripple position, will be described by referring to FIG. 23.

As shown in FIG. 23, three thin film piezoelectric resonators 11 are connected in series on first conductor 16 and two thin film piezoelectric resonators 12 are connected in parallel between the first conductor 16 and the second conductor 17.

A control voltage input node 13-1 is connected to all the electrodes of the thin film piezoelectric resonators 11 connected in series on the first conductor 16 by way respective resistances 18.

The control voltage is applied only to the thin film piezoelectric resonators 12 connected in parallel and not to the thin film piezoelectric resonators 11 connected in series.

The principle of operation of the variable filter adapted to change the ripple profile and the ripple position will be described below by referring to FIGS. 24(a) through 24(d).

FIG. 24(a) is a graph shows the resonance characteristic curve A of the thin film piezoelectric resonators 11 connected in series and the resonance characteristic curve B of the thin film piezoelectric resonators 12 connected in parallel when no voltage is applied to the filter.

As shown in FIG. 24(a), the resonators are combined in such a way that the resonance frequency fr(A) (bottom) of the thin film piezoelectric resonators 11 connected in series (characteristic curve A) coincides with the anti-resonance frequency far(B) (top) of the thin film piezoelectric resonators 12 connected in parallel (characteristic curve B).

FIG. 24(c) shows the band pass characteristic curve of the filter when no voltage is applied thereto.

As seen from FIG. 24(c), the filter operates as a band pass filter shows no ripple when no voltage is applied thereto. Then, a region where the insertion loss is minimal is found at the center of the band and the two center channels, or ch2 and ch3, are allowed to pass.

Then, a voltage is applied to the control voltage input node 13 of the circuit of FIG. 23.

With this arrangement, the resonance frequency fr(A) of the thin film piezoelectric resonators 11 connected in series and the anti-resonance frequency far(B) of the thin film piezoelectric resonators 12 connected in parallel are shifted slightly as shown in FIG. 24(d).

Thus, there is provided a filter showing a pass characteristic that the insertion loss is minimized at the anti-resonance frequency far(B) of the thin film piezoelectric resonators 12 connected in parallel and at the resonance frequency fr(A) of the thin film piezoelectric resonators 11 connected in series.

If, for instance, four channels exist in the pass band of this variable ripple type band pass filter, the two center band channels (ch2 and ch3) can be used out of the four channels when the filter shows a characteristic curve as illustrated in FIG. 24(c), whereas the upper and lower band channels (ch1 and ch4) can be used out of the four channels when the filter shows a characteristic curve as illustrated in FIG. 24(d).

In an experiment, a variable ripple profile type band pass filter circuit having a configuration as described above was prepared to find that a variable filter that shows a ripple to a slight extent but is adapted to produce a ripple profile that can minimize the insertion loss at least for the operating channel can more advantageously suppress the insertion loss of the operating channel than a band pass filter that does not produce any ripple and shows an insertion loss always lower than the required level for all the channels that can be used for operation. Additionally, such a variable ripple profile type band pass filter can suppress variances in the characteristic curve to a certain extent by controlling the voltage applied thereto so that it can be used highly advantageously in practical applications.

(Embodiment 5)

This embodiment is a high frequency filter adapted to change its rejection frequency and its band width, which will be described below by referring to FIGS. 25, 26(a) and 26(b). The thin film piezoelectric resonators of this embodiment can be prepared in a manner as described above for the first embodiment.

Referring to FIG. 26(b), in this band rejection filter, the anti-resonance frequency far(A) of the thin film piezoelectric resonators connected in series (characteristic curve A) and the resonance frequency fr(B) of the thin film piezoelectric resonators connected in parallel (characteristic curve B) are made to coincide with each other when no voltage is applied. Thus, the rejection filter is adapted to reject a certain frequency band.

Then, as a control voltage is applied, both the resonance frequency fr(A) and the anti-resonance frequency far(A) of the thin film piezoelectric resonators connected in series and both the resonance frequency fr(B) and the anti-resonance frequency far(B) of the thin film piezoelectric resonators connected in parallel are raised or dropped. In this way, the center frequency of the rejection band is caused to shift.

Alternatively, it may be so arranged that, as the control voltage is modified or no control voltage is applied, the anti-resonance frequency far(A) of the thin film piezoelectric resonators connected in series and the resonance frequency fr(B) of the thin film piezoelectric resonators connected in parallel are caused to coincide with each other when a voltage is applied. Further, the resonance frequency fr(A) of the thin film piezoelectric resonators connected in series and the anti-resonance frequency far(B) of the thin film piezoelectric resonators connected in parallel are caused to coincide with each other.

Then, as a control voltage is applied, the gap between the resonance frequency fr(A) and the anti-resonance frequency far(A) of the thin film piezoelectric resonators connected in series and the gap between the resonance frequency fr(B) and the anti-resonance frequency far(B) of the thin film piezoelectric resonators connected in parallel are changed. In this way, the pass band width is caused to change.

With this arrangement and as resonators having a larger capacitance are used as thin film piezoelectric resonators connected in series and those having a smaller capacitance are used as thin film piezoelectric resonators connected in parallel, the center frequency rises when a voltage is applied to raise both the resonance frequency of the thin film piezoelectric resonators connected in series and the anti-resonance frequency of the thin film piezoelectric resonators connected in parallel, whereas center frequency falls when a voltage is applied to drop both the resonance frequency of the thin film piezoelectric resonators connected in series and the anti-resonance frequency of the thin film piezoelectric resonators connected in parallel. In this way, it is possible to provide a variable rejection frequency type band pass filter.

The electromechanical coupling coefficient of ferroelectric thin film is raised to consequently broaden the gap between the resonance frequency and the anti-resonance frequency by applying the voltage in the direction of boosting the polarization of the ferroelectric thin film. Therefore, it is possible to broaden the pass band width of the band pass filter.

Additionally, if the frequency of an interference wave found outside the frequency band changes or if the frequency range where an interference wave can be found changes, the interference wave can be removed by a single notch filter arrangement. Therefore, this embodiment provides an advantage of down-sizing a filter circuit.

FIG. 25 is a circuit diagram of a variable block frequency type filter formed by using an unbalanced latter type filter.

As shown in FIG. 25, two thin film piezoelectric resonators 11 are connected in series on first conductor 16 and a thin film piezoelectric resonator 12 is connected in parallel between the first conductor 16 and the second conductor 17. A control voltage input node 13-1 is connected between the thin film piezoelectric resonators 11 connected in series.

With this arrangement, it is possible to equally apply the control voltage to the thin film piezoelectric resonators 11 connected in series and the thin film piezoelectric resonator 12 connected in parallel.

In the variable filter, the thin film piezoelectric resonators 11 connected in series have a low resonance frequency fr(A) and a small impedance, whereas the thin film piezoelectric resonator 12 connected in parallel has a high resonance frequency fr(B) and a large impedance.

As shown in FIG. 26(a), the anti-resonance frequency far(A) of the thin film piezoelectric resonators 11 connected in series and the resonance frequency fr(B) of the thin film piezoelectric resonator 12 connected in parallel are made to coincide with each other.

As the anti-resonance frequency of the thin film piezoelectric resonators 11 connected in series and the resonance frequency of the thin film piezoelectric resonator 12 connected in parallel are made to coincide with each other, the filter shows a band block characteristic that its block frequency is equal to the anti-resonance frequency and the resonance frequency that coincide with each other as seen from FIG. 26(b), which shows the notching characteristic of the filter whose block frequency is 1.77 GHz, where it produces an attenuation of −60 data base.

The block frequency of the band block filter is made to be variable by applying the control voltage so as to shift both the resonance frequency of the thin film piezoelectric resonators 11 connected in series and that of the thin film piezoelectric resonator 12 connected in parallel in a same direction.

In an experiment, a variable block frequency type filter having the above described configuration and a band pass filter were formed on a same substrate by using thin film piezoelectric resonators made of ferroelectric oriented film and connected in series to find that they successfully passed desired waves and removed interference waves. Furthermore, when a circuit for detecting fluctuations in the frequency band of the interference wave and applying a control voltage to the variable block frequency filter is added, they operated satisfactorily without saturating the downstream amplifier even when the interference wave fluctuated.

For example, the band of PHSs (around 1,900 MHz) and that of radio LANs (2,4 MHz) are located close to the 2,110 to 2,170 MHz band of W-CDMAs. It is possible to align the block frequency of the variable notch position type filter circuit with such an interference wave and move it to follow the latter if the channel of the latter is changed.

EXAMPLE 6

This embodiment is a switching filter adapted to select the band pass characteristic or the all block characteristic thereof by controlling the voltage applied to it, which will be described below by referring to FIGS. 27 through 30(d). The thin film piezoelectric resonators of this embodiment can be prepared in a manner as described above for the first embodiment.

Referring to FIG. 30(a), in this band block filter, the band pass characteristic obtained when the resonance frequency fr(A) of the thin film piezoelectric resonators connected in series (characteristic curve A) and the anti-resonance frequency far(B) of the thin film piezoelectric resonators connected in parallel (characteristic curve B) are made to coincide with each other (see FIG. 30(c)). Alternatively, the all block characteristic obtained when the resonance frequency fr(A) of the thin film piezoelectric resonators connected in series and the resonance frequency fr(B) of the thin film piezoelectric resonators connected in parallel are made to coincide with each other (see FIG. 30(d)) can be selected by applying the control voltage at least either to the thin film piezoelectric resonators connected in series or to the thin film piezoelectric resonators connected in parallel.

Thus, with this arrangement, either the band pass characteristic obtained when the resonance frequency of the thin film piezoelectric resonators connected in series and the anti-resonance frequency of the thin film piezoelectric resonators connected in parallel are made to coincide with each other (see FIG. 30(c)) or the all block characteristic obtained when the resonance frequency of the thin film piezoelectric resonators connected in series and the resonance frequency of the thin film piezoelectric resonators connected in parallel are made to coincide with each other (see FIG. 30(d)) can be selected only by using the control voltage. If such filters are always connected to a system and only the pass characteristic of the filter that corresponds to the current mode of operation of the system is selected while the all block characteristics of the remaining filters are exploited, the loss that will be produced when a switching element is inserted for the selection as in the case of the use of a PIN diode can be eliminated. Therefore, a filtering system that can minimize the insertion loss can be realized by using this embodiment of filter. Additionally, since ON/OFF operations do not involve the use of any active element, such a system can be realized by using an integrated module formed only by using passive elements to provide a remarkable practical advantage that a switching means can be realized on a very limited area.

Figure 27:
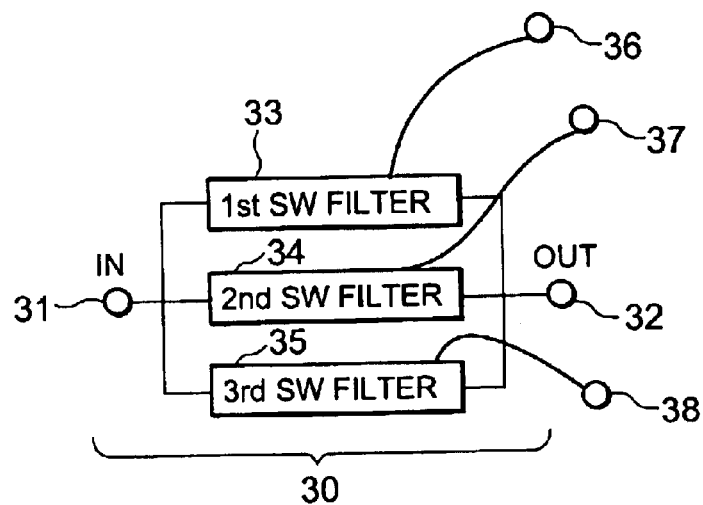
FIG. 27 is a schematic block diagram of still another embodiment of filter according to the invention, which is an out-of-band attenuation switching filter realized by using three switching filters.

FIG. 27 is a schematic block diagram of an out-of-band attenuation switching filter realized by using three switching filters according to the invention.

The out-of-band attenuation switching filter comprises first, second and third switching filters that are constantly connected to a system.

Figure 28:
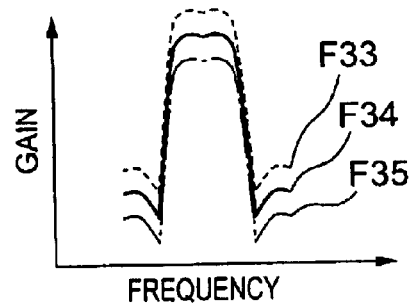
FIG. 28 is a graph illustrating the pass-gain of each of the switching filters of the out-of-band attenuation switching filter of FIG. 27.

As shown in FIG. 28, the three switching filters are made to have respective out-of-band attenuations F33, F34, F35 that are different from each other typically by using different numbers of filtering stages.

Figure 29:
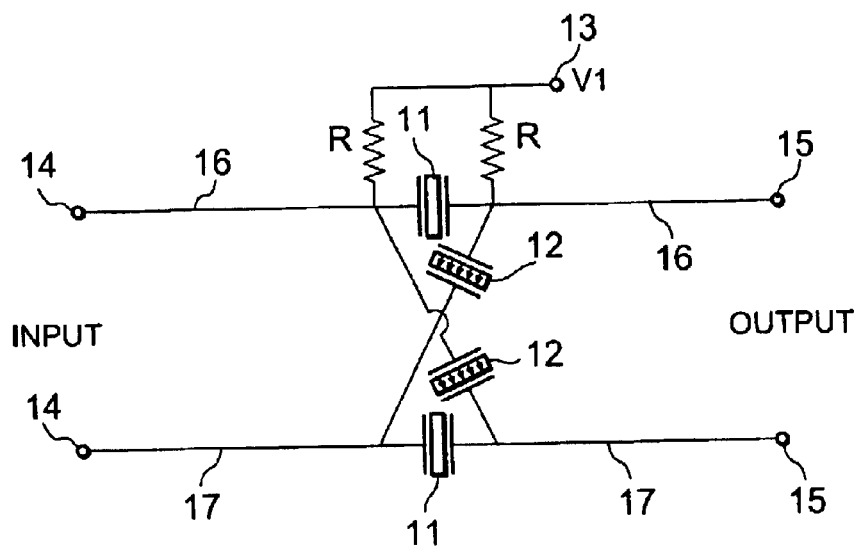
FIG. 29 is a circuit diagram of one of the switching filters of the out-of-band attenuation switching filter of FIG. 27.

FIG. 29 is a circuit diagram of the first switching filter whose out-of-band attenuation F33 and insertion loss are smallest.

The switching filter of FIG. 29 is a balanced lattice type filter in which a thin film piezoelectric resonator 11 is connected in series on a first conductor 16 and another thin film piezoelectric resonator 11 is connected in series on a second conductor 17, whereas two thin film piezoelectric resonators 12 are connected in parallel between the first conductor 16 and the second conductor 17. A control voltage input node 13 is connected to the opposite ends of the thin film piezoelectric resonator 11 connected in series on the first conductor 16 by way of respective resistances R. With this arrangement, the control voltage is applied only to the thin film piezoelectric resonators 12 connected in parallel and no voltage is applied to the thin film piezoelectric resonator 11 connected in series.

The principle of operation of this variable band width type filter will be described by referring to FIGS. 30(a) through 30(d).

FIG. 30(a) shows the frequency characteristic curves obtained when the anti-resonance frequency far(B) of the thin film piezoelectric resonators 12 connected in parallel (characteristic curve B) and the resonance character fr(A) of the thin film piezoelectric resonators 11 connected in series (characteristic curve A) are made to coincide with each other.

As shown in FIG. 30(c), the characteristics of the filter are those of a band pass filter (and correspond to an ON state).

As +V is applied to the control voltage input node 13 of the circuit of FIG. 29, the voltage is applied only to the two thin film piezoelectric resonators 12 connected in parallel. If the elastic coefficient is increased due to the voltage application, the resonance frequency of the two thin film piezoelectric resonators 12 connected in parallel rises.

When the resonance frequency fr(A) of the thin film piezoelectric resonators 11 connected in series and the resonance frequency fr(B) of the thin film piezoelectric resonators 12 connected in parallel are made to coincide with each other by modifying the control voltage as shown in FIG. 30(b), the filter comes to show characteristics of blocking all the frequency bands (which correspond to an OFF state).

In this way, either the band pass characteristic or the all block characteristic can be selected simply by modifying the control voltage so that the loss that will be produced when a switching element is inserted for the selection as in the case of the use of a PIN diode can be eliminated if the switching filters are connected in parallel.

In FIG. 27, three switching filters including the first switching filter 33, the second switching filter 34 and the third switching filter 35 are connected in parallel. Note that it is so arranged that the numbers of filtering stages of the first through third switching filters 33 through 35 are different from each other and the control voltage is applied to the first switching filter 33 from first voltage applying node 36, while the control voltage is applied to the second switching filter 34 from second voltage applying node 37 and to the third switching filter 35 from third voltage applying node 38. In FIG. 27, reference numeral 31 denotes a signal input node and reference numeral 32 denotes a signal output node.

FIG. 28 shows the pass characteristics of the out-of-band attenuation switching filter.

As seen from FIG. 28, the pass characteristic is such that the insertion loss is small but the out-of-band attenuation is also small when the number of filtering stages formed by combining thin film piezoelectric resonators connected in series and thin film piezoelectric resonators connected in parallel is small. On the other hand, the pass characteristic is such that the out-of-band attenuation is large but the insertion loss is also large correspondingly when the number of filtering stages is large.

When no interference wave is found near the wave to be received, the out-of-band attenuation may well be small and rather it is necessary to reduce the insertion loss in order to reduce the load of the down stream amplifier. Then, therefore, the first filter 33 is selected by the switching means. When, to the contrary, an interference wave is found near the wave to be received, it is necessary to increase the out-of-band attenuation in order to prevent the downstream amplifier from saturation if the insertion loss is increased. Then, therefore, the second filter 34 is selected for use. When the intensity of the interference wave is high, the third filter 35 whose out-of-band attenuation is even greater is selected for use.

Thus, with this embodiment, an appropriate one of the filters comprising thin film piezoelectric resonators formed by using ferroelectric oriented film that are adapted to down-sizing is selected by a switching means that involves only small loss depending on the presence or absence of an interference wave in order to avoid the trade off of out-of-band attenuation and insertion loss. Additionally, since the switching means can be integrally formed with thin film passive elements on a same substrate, it is possible to produce a very small filter module.

(Embodiment 7)

This embodiment is a variable filter that can be formed by combining any of the preceding embodiments. This embodiment will be described below by referring to FIG. 31 and FIGS. 32(a) through 32(d).

More specifically, a desired variable band pass filter can formed by using two or more than two such variable filters, each of which may be one that can change the center frequency of the pass band, the pass band width, the ripple position or the ripple profile, the notch position of the rejection band width.

With this arrangement, it is possible to produce a filter having a variable width that can hardly be realized by using a single filter adapted to change is characteristic performance.

For example, when variable center frequency filters as described above by referring to FIG. 19 are connected in series to form a filter circuit and a control voltage is applied thereto to raise the center frequency of the upstream variable frequency filter and lower that of the downstream variable frequency filter, the band width of the filter circuit can be significantly narrowed.

When different center frequencies are selected respectively for the upstream and downstream filters and the overlapping frequency range is used for filtering, the center frequencies can be shifted at a rate greater than the rate of shifting the pass band if the center frequencies of the upstream and downstream filters are moved in a same direction by applying a voltage. Such a combination of variable filters can advantageously find more practical applications in various systems due to its characteristics.

FIG. 31 is a circuit diagram of the embodiment of filter according to the invention, which is a variable band width type filter realized by connecting two variable center frequency type filters in series.

Referring to FIG. 31, the series connected variable band width type filter comprises a pair of thin film piezoelectric resonators 11-1, 11-2 connected in series on first conductor 16 and another pair of thin film piezoelectric resonators 11-3, 11-4 connected in series on second conductor 17 along with a total of four thin film piezoelectric resonators 12 connected in parallel between the first conductor 16 and the second conductor 17.

A control voltage input node 13 is connected between the first thin film piezoelectric resonator 11-1 connected in series and the second thin film piezoelectric resonator 11-2 connected in series on the first conductor 16. The control voltage input node 13 is also connected between the third thin film piezoelectric resonator 11-3 connected in series and the fourth thin film piezoelectric resonator 11-4 connected in series on the first conductor 17. For the sake of convenience, the filter located at the side of the input node 14 relative to the control voltage input node 13 is referred to as the first filter, whereas the filter located at the side of the output node 15 relative to the control voltage input node 13 is referred to as the second filter.

Now, the principle of operation of the variable band width type filter will be described by referring to FIGS. 32(a) through 32(d).

FIG. 32(a) shows the pass characteristic curve F1 of the first filter and the pass characteristic curve F2 of the second filter obtained when no voltage is applied thereto. The first and second filters are so designed that their respective pass bands overlap each other by Δf.

As shown in FIG. 32(a), the band pass filter obtained by connecting the first and second filters in series shows a characteristic curve F3 same as that of a band pass filter having a band width of Δf.

Referring now to FIG. 32(d), as a cartridge voltage is applied to change the resonance frequencies of the thin film piezoelectric resonators, the pass band of the first filter is shifted to the lower frequency side by Δf' and that of the second filter is shifted to the higher frequency side by αf'.

As shown in FIG. 32(d), the characteristic curve F4 of the band pass filter shows a band width of Δf+2Δf' as it is broadened by 2Δf' from the band width of the characteristic curve F3. In this way, it is possible to change the band width by externally applying a voltage.

This arrangement can be realized on the design concept as described below. If the first filter is required to show a pass band located at the lower frequency side relative to the pass band of the second filter, the four thin film piezoelectric resonators of the first filter needs to have a electrode film thickness greater than the four thin film piezoelectric resonators of the second filter so as to make them show lower a resonance frequency.

Then, as a positive voltage is applied to the control voltage input node, an electric field is applied to the four thin film piezoelectric resonators of the first filter in a direction same as that of polarization. Therefore, if the pass band of the first filter is shifted to the higher frequency side as a result of applying the control voltage, conversely the pass band of the second filter is shifted to the lower frequency side. If, on the other hand, the pass band of the first filter is shifted to the lower frequency side, conversely the pass band of the second filter is shifted to the higher frequency side. Thus, with the circuit configuration of this embodiment, the pass band of the first filter and that of the second filter are shifted in opposite directions when a control voltage is applied thereto so that consequently the overlapping part, or the pass band of the embodiment, can be broadened or narrowed appropriately.

As will be understood by reading the above explanation, the filter circuit shown in FIG. 31 is a variable pass band width type filter realized on the basis of the principle of operation as described above by referring to FIGS. 32(a) through 32(d). Thus, a variable pass band width type filter can be produced by adding a control voltage input node to a practically single filter circuit. In other words, conventional design techniques and process techniques for filter circuits comprising thin film piezoelectric resonators can be utilized for this embodiment of invention and all the components can be formed on a same substrate so that it is possible to realize a very small filter module.

This embodiment is particularly useful for a system such as CDMA2000 that employs a multi-carrier method and is adapted to change the band width of 2.5 MHz or 3.75 MHz by means of a plurality of carriers, each showing a band width of 1.25 MHz, only when a high speed operation is required because the embodiment can provide a large variable width and hence advantageously be used for systems requiring the band width to be changed to a large extent. Normally, the channel width is several MHz and it is difficult to prepare thin film piezoelectric resonators by using ferroelectric oriented film showing a coupling coefficient of 10% or more because the resultant band width is too large. However, this embodiment, which is a variable bandwidth filter showing a narrow band width, can dissolve such a problem because it is realized by connecting two filters, each showing a broad band width, in series.

(Embodiment 8)

FIG. 33 is a circuit diagram of this embodiment of variable filter, which is realized by connecting two variable center frequency type filters in series.

Referring to FIG. 33, the variable band width type filter comprises a pair of thin film piezoelectric resonators 11-1, 11-2 connected in series on first conductor 16 and another pair of thin film piezoelectric resonators 11-3, 11-4 connected in series on second conductor 17 along with a total of four thin film piezoelectric resonators 12 connected in parallel between the first conductor 16 and the second conductor 17.

A control voltage input node 13 is connected between the first thin film piezoelectric resonator 11-1 connected in series and the second thin film piezoelectric resonator 11-2 connected in series on the first conductor 16. The control voltage input node 13 is also connected between the third thin film piezoelectric resonator 11-3 connected in series and the fourth thin film piezoelectric resonator 11-4 connected in series on the first conductor 17.

From the circuit point of view, this embodiment is identical with the two-stage variable center frequency type filter illustrated in FIG. 21 but differs from the latter in terms of pass characteristics that is produced when no voltage is applied thereto.

Now, the principle of operation of this variable band width type filter will be described by referring to FIGS. 34(a) through 34(d). For the sake of convenience, the filter located at the side of the input node 14 relative to the control voltage input node 13 is referred to as the first variable center frequency type filter, whereas the filter located at the side of the output node 15 relative to the control voltage input node 13 is referred to as the second variable center frequency type filter.

FIG. 34(a) shows the pass characteristic curves F5, F6 of the first and second variable center frequency type filters obtained when no voltage is applied thereto. The pass characteristic curves show that their band widths are substantially same and the overlapping part of the frequency bands has a band width equal to that of a single channel.

As shown in FIG. 34(c), the embodiment is so regulated that, when the first and second variable center frequency type filters are connected in series, it shows a pass characteristic curve F7 of a band pass filter that provides a pass band width for a single channel. In this embodiment, it corresponds to Channel 1.

As a voltage is applied to the variable center frequency type filters to shift their pass bands to the higher frequency side by Δf, the channel of the pass band is also shifted to the higher frequency side by Δf to produce a pass characteristic curve F8 as shown in FIG. 34(b).

With known ordinary techniques, it is difficult to prepare a filter with a narrow band width that can be used for selecting a single channel by using a ferroelectric material having a large coupling coefficient and shift the pass band by several channels. This is because a material showing a large variable width such as ferroelectric oriented film has a large coupling coefficient and, conversely, a material having a small variable width shows a small variable width and is not adapted to prepare a variable center frequency type filter by using it.

However, this embodiment of two-stage variable center frequency type filter can be made to show a small band width by utilizing the wide tunability of ferroelectric. Therefore, this embodiment can find a large scope of practical applicability.

According to the invention, an isolator or a buffer amp 43 can be connected between any two filter units 41, 42 out of a plurality of cascade-connected filter units as shown in FIG. 35. With this arrangement, the degradation of pass band characteristics due to mismatching of impedances can be suppressed to provide a great practical advantage. In FIG. 35, reference numeral 44 denotes a variable voltage source.

According to the invention, it is also possible to make the center frequency of the pass band, the pass band width, the ripple position or the ripple profile, the notch position or the rejection band width, the out-of-band attenuation or the pass loss can be made variable by connecting two or more than two variable high frequency filters in parallel by way of a switch so that one of the filter can be selected by means of the switch.

With such an arrangement, it is possible to provide a variable characteristic filter showing a variable range that is broader than the one that can be obtained by connecting a plurality of variable filters in series.

For example, a first variable filter showing a characteristic feature of a small insertion loss and also a small out-of-band attenuation and a second variable filter showing a characteristic feature of a large insertion toss and a large out-of-band attenuation may be connected in parallel. Then, the downstream amplifier is prevented from being saturated by selectively using the first variable filter when no interference wave is found and switching to the second variable filter when an interference wave is found.

It is difficult to realize a variable frequency channel selection filter for selecting a channel of a 900 MHz band or a channel of 2 GHz band by using a single filter and connecting two or more than two variable filter in series. However, such a filter can be realized by connecting separate filters in series that are adapted to the respective channels.

The use of a switching filter described above by referring to the first embodiment provides practical advantages including a small insertion loss as switching means for selecting one of a plurality of variable filters that are connected in parallel.

The use of a single crystal or oriented ferroelectric material having an orientation full width at half maximum not smaller than 0.1° and not greater than 5° is preferable for thin film piezoelectric resonators to be used in a variable filter.

An ideal ferroelectric material is polarized in the proper positional direction even when no voltage is applied thereto.

However, when defects are introduced or the lattice constant shows variances, regions where polarization is not neatly oriented can be produced in the film when no voltage is applied thereto, although polarization comes to be oriented in such regions to remarkably change the coupling coefficient once a low voltage is applied. Therefore, to provide a large rate of change in response to the applied voltage, a ferroelectric material whose orientation is slightly disordered may preferably be used rather than an ideal single crystal ferroelectric material.

As a result of elaborate experiments, it was found that the coupling coefficient is provided with voltage dependency of a level necessary for practical applications when the orientation full width at half maximum as observed by X-ray diffractometry is not smaller than 0.1°. However, if the orientation full width at half maximum is too large, there arises a problem that the electro-mechanical coupling coefficient does not increase sufficiently if a voltage is applied. As a result of elaborate experiments, it was found that the material constants including the electromechanical coupling coefficient change remarkably when the orientation full width at half maximum as observed by X-ray diffractometry is not smaller than 0.1° and a large coupling coefficient can be obtained by applying a voltage when the orientation full width at half maximum is not greater than 5°. Therefore, the orientation full width at half maximum is preferably not smaller than 0.1° and not greater than 0.5°.

Piezoelectric film to be used for thin film piezoelectric resonators is preferably made of barium titanate.

Barium titanate shows a large electro-mechanical coupling coefficient of about 20% and the voltage dependency of its elastic coefficient and coupling coefficient is large if compared with other piezoelectric materials. Additionally, its specific dielectric constant is 200 or more and hence by far larger than that of any other comparable material such as AlN or ZnO. Therefore, it is highly suited for forming a variable characteristic filters and small switching type filters. Additionally, unlike PZT, it is thermodynamically stable and does not contain any harmful metal. Hence, it is a highly promising material for practical applications.

Thus, according to the invention, there is provided a high frequency filter that is adapted to change its pass characteristics by using an appropriate external control means.

What is claimed is:

1. A high frequency filter comprising:
   a signal input node;
   a signal output node;
   a plurality of thin film piezoelectric resonators being coupled with the signal input and the signal output nodes, and including at least one of a variable resonance thin film piezoelectric resonator which has a ferroelectric thin film polarized in its thickness direction, the ferroelectric thin film with an orientation full width at half maximum not smaller than 0.1° and not greater than 5°, and a pair of electrodes formed on the opposite major surfaces of the thin film with variable resonance characteristics to be changed in response to an applied voltage between the pair of electrodes; and
   a voltage source being connected to the variable resonance thin film piezoelectric resonator so that a filtering characteristic of the variable resonance thin film piezoelectric resonator is controlled by changing the voltage applied from the voltage source.

2. A high frequency filter comprising:
   a signal input node;
   a signal output node;
   a first variable resonance thin film piezoelectric resonator being coupled in series with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes;
   a second variable resonance thin film piezoelectric resonator being coupled in parallel with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes; and
   a voltage source being connected to the first and second variable resonance thin film piezoelectric resonator to apply the voltage between the pair of electrodes so that a filtering characteristic of at least one of the variable resonance thin film piezoelectric resonators is controlled by changing the voltage applied from the voltage source, the voltage source being adapted to apply a variable voltage to one of the first variable resonance thin film piezoelectric resonators connected in series or the second variable resonance thin film piezoelectric resonator connected in parallel, and a constant voltage to the other thin film piezoelectric resonator.

3. A high frequency filter comprising:
   a signal input node;
   a signal output node;
   a first variable resonance thin film piezoelectric resonator being coupled in series with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes;
   a second variable resonance thin film piezoelectric resonator being coupled in parallel with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes; and
   a voltage source being connected to the first and second variable resonance thin film piezoelectric resonator to apply the voltage between the pair of electrodes so that a filtering characteristic of at least one of the variable resonance thin film piezoelectric resonators is controlled by changing the voltage applied from the voltage source,
   the filter comprising a variable voltage source changing the voltage applied to at least one of the thin film piezoelectric resonator connected in series and the thin film piezoelectric resonator connected in parallel to change at least one of a gap between the resonance frequency and the anti-resonance frequency of the thin film piezoelectric resonator connected in series and a gap between the resonance frequency and the anti-resonance frequency of the thin film piezoelectric resonator connected in parallel as the anti-resonance frequency of the thin film piezoelectric resonator connected in series and the resonance frequency of the thin film piezoelectric resonator connected in parallel are coincident with each other, whereby a rejection band of the filter is controlled.

4. A high frequency filter comprising:

a signal input node;

a signal output node;

a first variable resonance thin film piezoelectric resonator being coupled in series with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes;

a second variable resonance thin film piezoelectric resonator being coupled in parallel with the signal input and the signal output nodes, which has a ferroelectric thin film polarized in the thickness direction and a pair of electrodes formed on the opposite major surfaces of the thin film with a variable resonance characteristic to be changed in response to an applied voltage between the pair of electrodes; and a voltage source being connected to the first and second variable resonance thin film piezoelectric resonator to apply the voltage between the pair of electrodes so that a filtering characteristic of at least one of the variable resonance thin film piezoelectric resonators is controlled by changing the voltage applied from the voltage source, the voltage source changing the voltage applied to the thin film piezoelectric resonator connected in series or the thin film piezoelectric resonator connected in parallel to select a pass band mode obtained when the resonance frequency of the thin film piezoelectric resonator connected in series and the anti-resonance frequency of the thin film piezoelectric resonator connected in parallel are substantially coincident with each other or all rejection band mode obtained when the resonance frequency of the thin film piezoelectric resonator connected in series and the resonance frequency of the thin film piezoelectric resonator connected in parallel are substantially coincident with each other.

* * * * *